United States Patent
Tokano et al.

(10) Patent No.: US 7,936,015 B2
(45) Date of Patent: *May 3, 2011

(54) SEMICONDUCTOR DEVICE HAVING TRENCHES FILLED WITH A SEMICONDUCTOR HAVING AN IMPURITY CONCENTRATION GRADIENT

(75) Inventors: Kenichi Tokano, Kawasaki (JP); Tetsuo Matsuda, Ibo-gun (JP); Wataru Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 68 days.

This patent is subject to a terminal disclaimer.

(21) Appl. No.: 12/543,165

(22) Filed: Aug. 18, 2009

(65) Prior Publication Data

US 2009/0302373 A1 Dec. 10, 2009

Related U.S. Application Data

(63) Continuation of application No. 11/364,203, filed on Mar. 1, 2006, now Pat. No. 7,595,530.

(30) Foreign Application Priority Data

Mar. 1, 2005 (JP) .................................. 2005-055369

(51) Int. Cl.
*H01L 29/772* (2006.01)
(52) U.S. Cl. .......... 257/341; 257/E29.257; 257/E29.262
(58) Field of Classification Search .................. 257/341, 257/342, E29.262, E29.257
See application file for complete search history.

(56) References Cited

U.S. PATENT DOCUMENTS

| | | | |
|---|---|---|---|
| 6,495,294 B1 | 12/2002 | Yamauchi et al. | |
| 6,627,949 B2 | 9/2003 | Blanchard | |
| 6,656,797 B2 | 12/2003 | Blanchard | |
| 6,740,931 B2* | 5/2004 | Kouzuki et al. | 257/341 |
| 6,888,195 B2 | 5/2005 | Saito et al. | |
| 7,595,530 B2* | 9/2009 | Tokano et al. | 257/335 |
| 2004/0185665 A1* | 9/2004 | Kishimoto et al. | 438/689 |
| 2005/0006699 A1 | 1/2005 | Sato et al. | |

FOREIGN PATENT DOCUMENTS

| | | |
|---|---|---|
| JP | 2004-72068 | 3/2004 |
| JP | 2004-119611 | 4/2004 |
| JP | 2004-134714 | 4/2004 |

* cited by examiner

*Primary Examiner* — Benjamin P Sandvik
*Assistant Examiner* — W. Wendy Kuo
(74) *Attorney, Agent, or Firm* — Oblon, Spivak, McClelland, Maier & Neustadt, L.L.P.

(57) ABSTRACT

A single crystal semiconductor layer of a first conduction type is disposed on a surface of a semiconductor substrate. A plurality of trenches are provided in the semiconductor layer to form a plurality of first semiconductor regions of the first conduction type at intervals in a direction parallel to the surface. An epitaxial layer is buried in the plurality of trenches to form a plurality of second semiconductor regions of a second conduction type. The plurality of second semiconductor regions each includes an outer portion with a high impurity concentration formed against an inner wall of the trench, and an inner portion with a low impurity concentration formed inner than the outer portion.

7 Claims, 15 Drawing Sheets

SEMICONDUCTOR DEVICE HAVING TRENCHES FILLED WITH A SEMICONDUCTOR HAVING AN IMPURITY CONCENTRATION GRADIENT

CROSS REFERENCE TO RELATED APPLICATION

This application is based on a continuation of U.S. application Ser. No. 11/364,203 filed Mar. 1, 2006, and claims the benefit of priority from prior Japanese Patent Application No. 2005-055369, filed on Mar. 1, 2005, the entire contents of each of which are incorporated herein by reference.

BACKGROUND OF THE INVENTION

1. Field of the Invention

The present invention relates to a semiconductor device such as a power MOSFET (Metal Oxide Semiconductor Field Effect Transistor).

2. Description of the Related Art

A power semiconductor device, typically a power MOSFET, comprises a semiconductor chip structured such that a plurality of cells having commonly connected gates are formed in an epitaxial layer (semiconductor region) disposed on a semiconductor substrate. The power MOSFET, having a low on-resistance and a possibility of fast switching, can control a high-frequency large current efficiently. Accordingly, the power MOSFET has been used widely as a small power converter such as a component of a power source in a personal computer.

The power MOSFET includes a semiconductor region connecting a source region to a drain region, which is generally referred to as a drift region. When the power MOSFET is turned on, the drift region serves as a current path. When it is turned off, a depletion layer extends from a pn junction formed between the drift region and a base region to retain the breakdown voltage of the power MOSFET.

The on-resistance of the power MOSFET greatly depends on the electric resistance of the drift region. Therefore, lowering the on-resistance may require an increase in the impurity concentration in the drift region to lower the electrical resistance of the drift region. An increased impurity concentration in the drift region, however, makes the extension of the depletion layer insufficient and lowers the breakdown voltage. Thus, in the power MOSFET, lowering the on-resistance and elevating the breakdown voltage are related to have a tradeoff therebetween.

To solve the problem, there has been proposed a power MOSFET, which includes a drift region having a superjunction structure (JP-A 2004-134714, Paragraphs 0043-0051, FIGS. 15-17). The superjunction structure is such a structure that includes p-type semiconductor regions in the form of pillars and n-type semiconductor pillar regions in the form of pillars ,periodically arranged in a direction parallel to the surface of a semiconductor substrate. Depletion layers extend from pn junctions formed between these semiconductor regions to retain the breakdown voltage. Accordingly, even if increasing the impurity concentration to lower the on-resistance reduces the extension of the depletion layer, reducing the widths of these semiconductor regions makes it possible to completely deplete these semiconductor regions. Therefore, the superjunction structure is capable of lowering the on-resistance and elevating the breakdown voltage of the power MOSFET at the same time.

For further elevating the breakdown voltage, there has been proposed another power MOSFET, in which the impurity in a p-type semiconductor region and the impurity in an n-type semiconductor region are balanced, that is, charge-balanced (JP-A 2004-119611, Paragraphs 0062-0065, FIG. 7).

SUMMARY OF THE INVENTION

In one aspect the present invention provides a semiconductor device, comprising: a semiconductor substrate; a plurality of first semiconductor regions of a first conduction type formed by disposing a single crystal semiconductor layer of the first conduction type on a surface of the semiconductor substrate and providing a plurality of trenches in the single crystal semiconductor layer, the plurality of first semiconductor regions being formed at intervals in a direction parallel to the surface; and a plurality of second semiconductor regions of a second conduction type formed of an epitaxial layer buried in the plurality of trenches, the plurality of second semiconductor regions each including an outer portion with a high impurity concentration formed against an inner wall of the trench, and an inner portion with a low impurity concentration formed inner than the outer portion.

In another aspect the present invention provides a semiconductor device, comprising: a semiconductor substrate; a plurality of first semiconductor regions of a first conduction type formed by disposing a single crystal semiconductor layer of the first conduction type on a surface of the semiconductor substrate and providing a plurality of trenches in the single crystal semiconductor layer, the trenches each having the bottom and side with a width extending as becoming more distant from the bottom, and the plurality of first semiconductor regions being formed at intervals in a direction parallel to the surface; and a plurality of second semiconductor regions of a second conduction type formed of an epitaxial layer buried in the plurality of trenches, wherein the plurality of first semiconductor regions have impurity concentrations controlled to elevate as becoming more distant from the surface.

In yet another aspect the present invention provides a semiconductor device, comprising: a semiconductor substrate; a plurality of first semiconductor regions of a first conduction type formed by disposing a single crystal semiconductor layer of the first conduction type on a surface of the semiconductor substrate and providing a plurality of trenches in the single crystal semiconductor layer, the plurality of first semiconductor regions being formed at intervals in a direction parallel to the surface; and a plurality of second semiconductor regions of a second conduction type formed of an epitaxial layer buried in the plurality of trenches, wherein the plurality of first and second semiconductor regions have respective impurity concentrations controlled to elevate as becoming more distant from the surface.

DETAILED DESCRIPTION OF THE INVENTION

Figure 1:
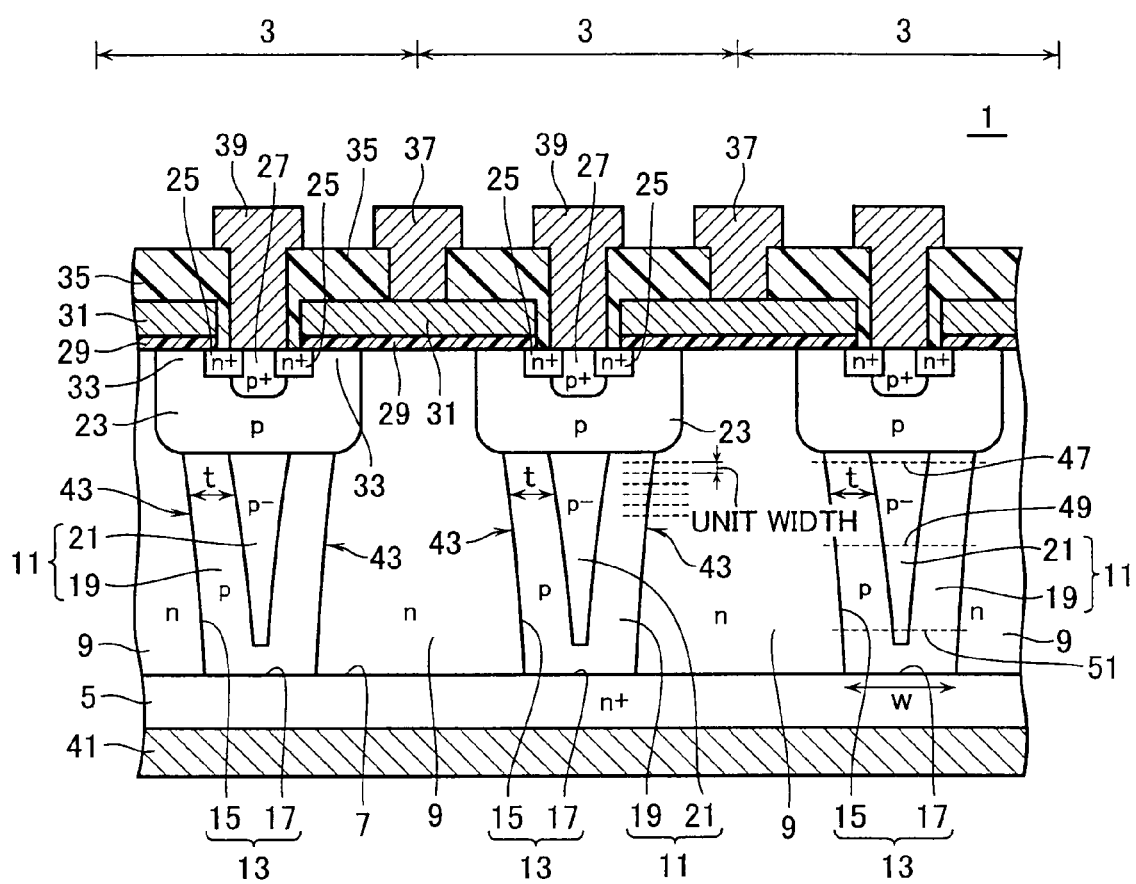
FIG. 1 is a vertical cross-sectional view of part of a semiconductor device according a first embodiment.

Embodiments of the present invention will now be described below with reference to the drawings. In the figures illustrative of the embodiments, the parts same as or similar to those denoted with the reference numerals in the figure described once are given the same reference numerals to avoid duplicate description thereof.

First Embodiment

A semiconductor device according a first embodiment is mainly characterized by comprising n-type first semiconductor regions, and p-type second semiconductor regions formed in trenches each having a width extending as becoming more distant from the bottom thereof. The second semiconductor region includes an outer portion with a high impurity concentration formed against an inner wall of the trench, and an inner portion with a low impurity concentration formed inside the outer portion.

(Structure of Semiconductor Device)

FIG. 1 is a vertical cross-sectional view of part of the semiconductor device 1 according the first embodiment. The semiconductor device 1 is a vertical power MOSFET structured such that a number of MOSFET cells 3 are connected in parallel. The semiconductor device 1 comprises a semiconductor substrate (such as a silicon substrate) 5, and a plurality of n-type first semiconductor regions 9 and a plurality of p-type second semiconductor regions 11, disposed on a surface 7 of the substrate.

The n-type is an example of the first conduction type while the p-type is an example of the second conduction type. In this embodiment, "n$^-$", "n", and "n$^+$" are used to indicate the n-type impurity concentrations while "p$^-$", "p", and "p$^+$" are used to indicate the p-type impurity concentrations. With reference to "n", "n$^+$" indicates a higher n-type impurity concentration and "n$^-$" indicates a lower n-type impurity concentration, as in the case of p-type.

The n-type semiconductor substrate 5 has an impurity concentration of "n+" and serves as a drain region. The n-type first semiconductor regions 9 have an impurity concentration of "n". They are formed in an n-type single crystal semiconductor layer (such as a single crystal silicon layer) disposed on the surface 7 of the semiconductor substrate 5 with a plurality of trenches 13 provided therein. Thus, the first semiconductor regions 9 are arranged in a direction parallel to the surface 7 of the semiconductor substrate 5 to serve as drift regions.

The trench 13 is defined by the side 15 and the bottom 17 and has a width determined to extend as becoming more distant from the bottom 17. The p-type second semiconductor regions 11 are composed of an epitaxial layer buried in the trenches 13, in other words, a single crystal semiconductor layer (such as a single crystal silicon layer) buried in the trenches 13 by a process of epitaxial growth.

The p-type second semiconductor region 11 includes an outer portion 19 and an inner portion 21, both having the direction of the length in the direction of the depth of the trench 13. The outer portion 19 is formed against the entire surface of an inner wall of the trench 13 (that is, the side 15 and the bottom 17). On formation of the outer portion 19, the thickness thereof, t (along a horizontal direction, that is, a direction parallel to the substrate 5), is almost constant and smaller than half the width, w, of the bottom 17. Note that "almost constant" means in this case that its margin of error is between plus and minus 20%. The thickness t of the outer portion 19 may vary through subsequent activation and thermal treatment steps in production of the semiconductor device. The inner portion 21 is formed inner than the outer portion 19 and buried in a space defined by the outer portion 19. The outer portion 19 has an impurity concentration of "p" while the inner portion 21 an impurity concentration of "p$^-$". Accordingly, the outer portion 19 is controlled to have a higher impurity concentration while the inner portion 21 is controlled to have a lower impurity concentration.

The second semiconductor region 11 thus configured may also be represented as follows. The second semiconductor region 11 includes a central portion and side portions located closer to the junction with the first semiconductor region 9 than the central portion and has impurity concentrations controlled relatively lower in the central portion than in the side portions in the lateral direction.

The first and second semiconductor regions 9, 11 are formed in the shape of pillars, which configure a superjunction structure. In more detail, the n-type first semiconductor regions 9 and the p-type second semiconductor regions 11 are arranged alternately and repeatedly in the direction parallel to the surface 7 of the semiconductor substrate 5 such that these regions 9, 11 can be depleted completely when the semiconductor device 1 is turned off. The "direction parallel to the surface 7 of the semiconductor substrate 5" may be referred to as the "lateral direction", and "alternately and repeatedly" as "periodically", in another way.

The first and second semiconductor regions 9, 11 include portions located opposite the semiconductor substrate 5, in which p-type base regions (often referred to as body regions) 23 are formed at a certain pitch. The base region 23 has an impurity concentration of "p", locates above the second semiconductor region 11, and has a width generally wider than that of the region 11. Each base region 23 includes an n-type source region 25 formed therein. In more detail, the source region 25 extends from the surface to the inside of the base region 23 between the central portion and the end portion of the base region 23. The source region 25 has an impurity concentration of "n+". The central portion of the base region 23 includes a p-type contact region 27 formed therein to serve as a contact portion of the base region 23. This region 27 has an impurity concentration of "p+".

Above the end portion of the base region 23, a gate electrode 31 composed, for example, of polysilicon is formed on a gate insulator 29. The end portion of the base region 23 serves as a channel region 33. An interlayer insulator 35 is formed to cover the gate electrode 31.

The interlayer insulator 35 is provided with through-holes each for exposing the central portion of the gate electrode 31 therethrough, and a gate lead 37 composed, for example, of aluminum is formed therein. Plural gate electrodes 31 are commonly connected through the gate lead 37. The interlayer insulator 35 is provided with through-holes each for exposing a portion of the source region 25 close to the contact region 27 and the contact region 27, and a source electrode 39 is formed therein. Plural source electrodes 39 are commonly connected. Over the entire rear surface of the semiconductor substrate 5, a drain electrode composed, for example, of nickel or gold is attached.

(Operation of Semiconductor Device)

The semiconductor device 1 will be described in operation with reference to FIG. 1. In operation, the source region 25 and the base region 23 are grounded in each MOSFET 3. To the drain region, or the semiconductor substrate 5, a certain positive voltage is applied through the drain electrode 41.

When the semiconductor device 1 is turned on, a certain positive voltage is applied to the gate electrode 31 in each MOSFET 3. As a result, an n-type inversion layer is formed in the channel region 33. Electrons (charged bodies) from the source region 25 are injected through the inversion layer into the drift region, or the n-type first semiconductor region 9, and reach the drain region, or the semiconductor substrate 5. Accordingly, current flows from the semiconductor substrate 5 to the source region 25.

When the semiconductor device 1 is turned off, on the other hand, the voltage applied to the gate electrode 31 is controlled such that the potential at the gate electrode 31 becomes lower than the potential at the source region 25 in each MOSFET 3. As a result, the n-type inversion layer in the channel region 33 disappears to halt the injection of electrons (charged bodies) from the source region 25 into the n-type first semiconductor region 9. Accordingly, no current flows from the drain region, or the semiconductor substrate 5, to the source region 25. In addition, depletion layers extending from pn junctions 43 formed between the first and second semiconductor regions 9, 11 completely deplete the regions 9, 11 and retain the breakdown voltage of the semiconductor device 1.

(Major Effect of First Embodiment)

Figure 2:
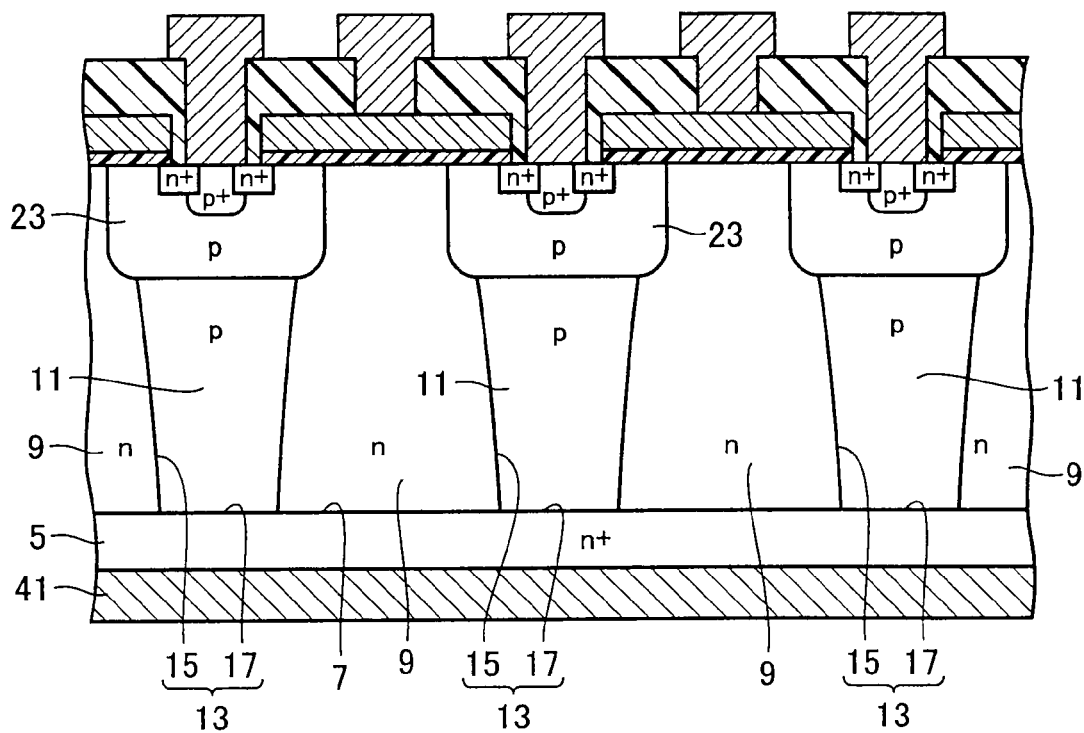
FIG. 2 is a vertical cross-sectional view of part of a semiconductor device according a comparative example.

The semiconductor device 1 shown in FIG. 1 according to the first embodiment is possible to improve the charge balance between the first and second semiconductor regions 9, 11 and enhance the breakdown voltage. This effect is described in comparison with a comparative example. FIG. 2 is a vertical cross-sectional view of part of a semiconductor device 45 according to the comparative example, which corresponds to FIG. 1. The semiconductor device 45 comprises p-type second semiconductor regions 11, which are not divided into the outer portion and the inner portion and have an overall impurity concentration of "p". This is different from the first embodiment.

Hereinbelow, in order to clarify the effect of the embodiment, explanation are performed, wherein the first and second semiconductor regions 9 and 11 in FIG. 1 and FIG. 2 are divided by a unit width (i.e. 1 micrometer; see FIG. 1) respectively, in a direction from the surface 7 toward the source region 25 (a vertical direction). The regions in the first semiconductor region 9 divided by the unit width are referred to, seeing from the surface 7, as a region N1, N2, . . . Nm, while the regions in the second semiconductor region 11 divided by the unit width are referred to, seeing from the surface 7, as a region P1, P2, . . . Pm. Note that the perspective widths of the region Nr (r=1, 2, . . . , or m) and the region Pr are equal or almost equal. The definition of the regions Nr and Pr are similarly used in the other embodiments below, unless defined otherwise.

The comparative example and the first embodiment are both designed such that the trench 13 has a width that extends as becoming more distant from the bottom 17. This is effective to bury the epitaxial layer, or the second semiconductor region 11, easily into the trench 13.

The shape of such the trench 13 defines the first semiconductor region 9 as having a width that reduces as becoming more distant from the surface 7. The phrase "as becoming more distant from the bottom 17" has the same meaning as the phrase "as becoming more distant from the surface 7" has. The entire of the first semiconductor region 9 has an impurity concentration of "n" and the first semiconductor region 9 has a width that reduces as becoming more distant from the surface 7. Accordingly, the number of impurity atoms (the number of carriers) in each of the region N1, N2, . . . , Nm becomes smaller in the more distant region from the surface 7.

In the comparative example, the entire of the second semiconductor region 11 has an impurity concentration of "p" and the number of impurity atoms in each of the region P1, P2, . . . Pm increases in the more distant regions from the surface 7. Therefore, as becoming more distant from the surface 7, the number of impurity atoms decreases in the region N1, N2, . . . Nm and increases in the region P1, P2, . . . Pm to the contrary. Accordingly, the charge balance between the first semiconductor region 9 and the second semiconductor region 11 breaks greatly and lowers the breakdown voltage of the semiconductor device 45.

In contrast, the second semiconductor region 11 shown in FIG. 1 according to the first embodiment has such the structure that is divided into the outer portion 19 with a high impurity concentration and the inner portion 21 with a low impurity concentration. Therefore, (1) with regard to the second semiconductor region 11, the impurity is mainly present in the outer portion 19. In addition, (2) on formation of the outer portion 19, the thickness, t, of the outer portion 19 is made almost constant. Accordingly, on formation of the outer portion 19, the size of the portion occupied by the outer portion 19 in the width of the second semiconductor region 11 in vertical section has the same value (=2 t) at an upper portion 47 (a region P3), a middle portion 49 (a region P2) and a lower portion 51 (a region P1). The limitation, "on formation of the outer portion 19", is given above because the thickness, t, of the outer portion 19 may vary through subsequent activation and thermal treatment steps in production of the semiconductor device. Note that the distances between the portion 47, 49 and 51 are approximately 10 micrometers.

With the above (1) and (2), in the first embodiment the number of impurity atoms in the regions P1, P2, . . . Pm hardly varies so much and remains almost unchanged as becoming more distant from the surface 7. Therefore, in the first embodiment, the number of impurity atoms in the regions N1, N2, . . . Nm decreases as becoming more distant from the surface 7 while the number of impurity atoms in the regions P1, P2, . . . Pm hardly varies so much and remains almost unchanged as becoming more distant from the surface 7 (in this specification, "almost unchanged" means that difference in the number of impurity atoms between two regions is less than 20 percents). Accordingly, the break of the charge balance between the first semiconductor region 9 and the second semiconductor region 11 can be made smaller than the comparative example.

In addition, the impurity concentration in the n-type semiconductor region and the impurity concentration in the p-type semiconductor region may be intentionally made different slightly. (For example, in the direction of the depth of the trench, the impurity concentration in the n-type semiconductor region is controlled to gradually elevate while the impurity concentration in the p-type semiconductor region is controlled to gradually lower). This is effective to establish the charge balance and improve the breakdown voltage. Variations in process inevitably caused in steps of manufacturing the semiconductor device make it difficult, however, to accurately form the semiconductor regions having such the impurity profiles. In contrast, in the first embodiment, the second semiconductor region 11, including the outer portion 19 having an impurity concentration of "p" and the inner portion 21 having an impurity concentration of "p⁻", is charge-balanced with the first semiconductor region 9 having an impurity concentration of "n". Accordingly, even if variations are caused in process more or less, it is possible to accurately form a semiconductor region having a desired impurity profile.

(Method of Manufacturing Semiconductor Device)

A method of manufacturing the semiconductor device 1 according to the first embodiment is described with reference to FIGS. 1, 3-9. FIGS. 3-9 are vertical cross-sectional views showing the method of manufacturing the semiconductor device 1 shown in FIG. 1 step by step.

Figure 3:
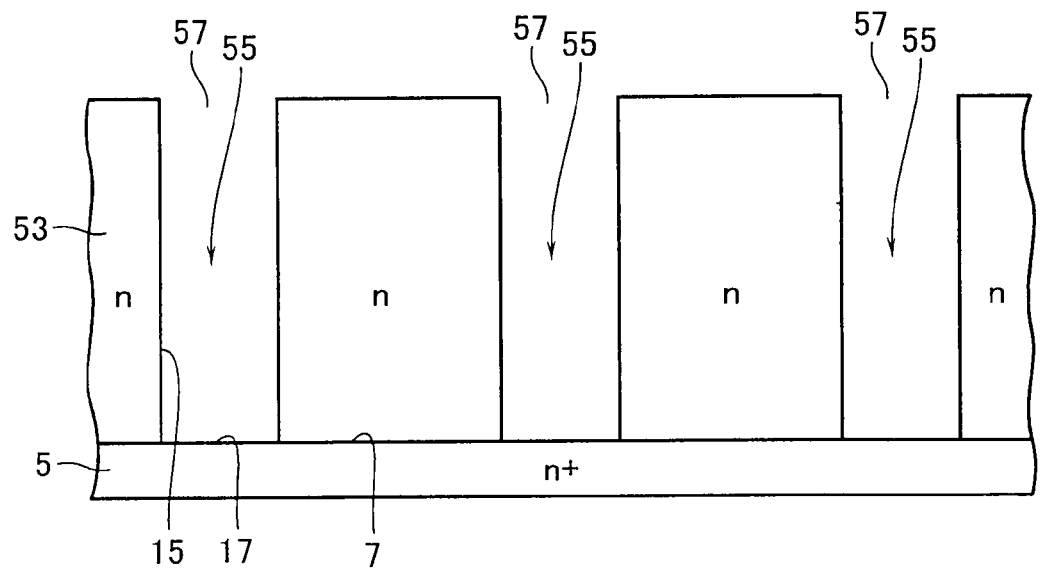
FIG. 3 shows a first step in a method of manufacturing the semiconductor device according the first embodiment.

As shown in FIG. 3, a semiconductor substrate 5 is prepared, which has an n-type impurity concentration of $1\times10^{18}$ cm$^{-3}$ or higher, for example. Over the entire surface 7 of the semiconductor substrate 5, an n-type, single crystal semiconductor layer 53 is formed through a process of epitaxial growth, which has an n-type impurity concentration of $1\times10^{15}$ to $1\times10^{16}$ cm$^{-3}$, for example. Thereafter, with a mask of a silicon oxide film or the like, not shown, the single crystal semiconductor layer 53 is selectively etched by RIE (Reactive Ion Etching), for example. As a result, plural trenches 55 reaching the semiconductor substrate 5 are formed at certain intervals in the direction parallel to the surface 7 of the semiconductor substrate 5. The side 15 of the trench 55 is almost vertical and accordingly the width of the trench 55 is almost same within a range from an entry 57 to the bottom 17. The trench 55 has a width of 4 μm and an aspect ratio of 20 or higher, for example.

Figure 4:
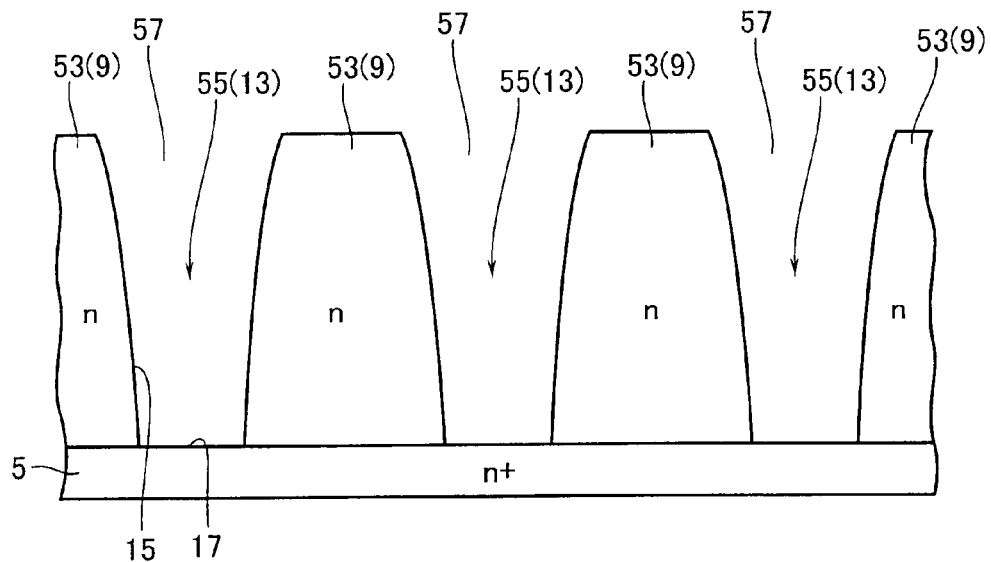
FIG. 4 shows a second step in the same method.

As shown in FIG. 4, a HCl gas, for example, is employed to etch the side 15 of the trench 55. The etched extent of the side 15 decreases as approaching from the entry 57 to the bottom 17 of the trench 55. Accordingly, the width of the trench 55 reduces as approaching from the entry 57 to the bottom 17. This etching forms plural trenches 13 having a width extending as becoming more distant from the bottom 17. In this way, the trenches 13 are formed in the single crystal semiconductor layer 53 to form the first semiconductor regions 9. Instead of forming the trenches 55 shown in FIG. 3, publicly known etching technologies may be employed to directly form the trenches 13 shown in FIG. 4.

Figure 5:
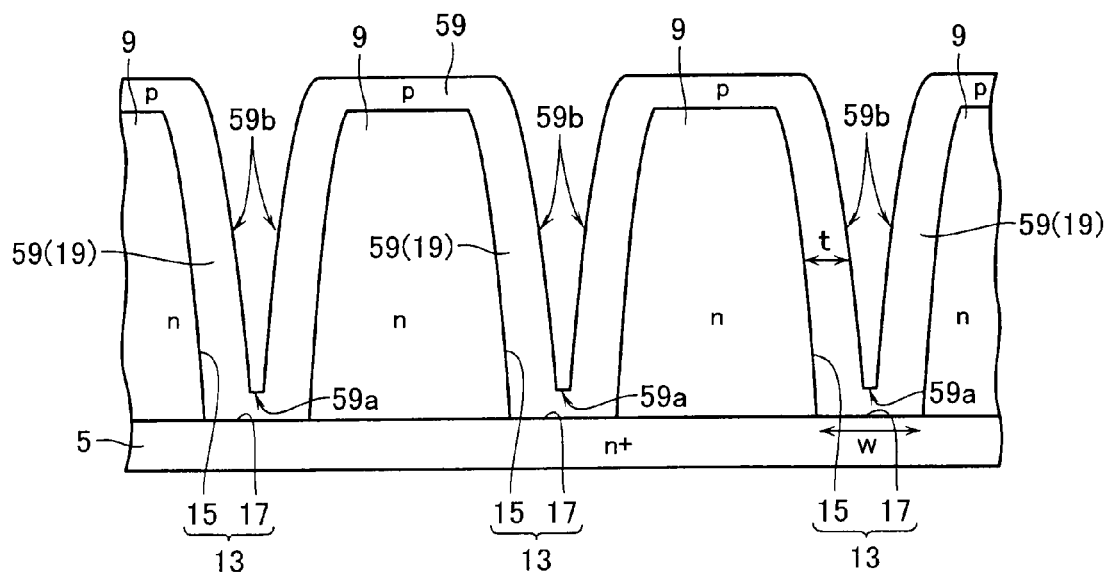
FIG. 5 shows a third step in the same method.

As shown in FIG. 5, a p-type epitaxial layer 59 is grown on the first semiconductor regions 9 and on the side 15 and the bottom 17 of the trench 13. The condition of this epitaxial growth includes a material gas such as a mixed gas of $SiH_2$ and $Cl_2$, an impurity gas of $B_2H_6$, and a temperature of 1000° C., for example. Instead of the above mixed gas, (1) $SiH_2Cl_2$, (2) $SiH_4$, (3) $SiCl_4$, and (4) $SiHCl_3$ may be employed as a material gas. Introduction of the impurity gas is halted at the moment when the thickness t of the epitaxial layer 59 reaches almost half the width w of the bottom 17. In other word, a grown surface 59a from the bottom 17 of the trench 13 remains, and grown surfaces 59b from the sides 15 of the trenches 13 separate from each other in this state. As a result, an outer portion 19 is formed against an inner wall of the trench 13 (that is, the side 15 and the bottom 17), which has a high and almost uniform impurity concentration and an almost constant thickness t. The epitaxial layer 59 has a p-type impurity concentration of $1\times10^{15}$ to $1\times10^{16}$ cm$^{-3}$, for example.

The thickness t of the epitaxial layer 59 is not limited to almost half the width w of the bottom 17. Even if the thickness t is smaller or even large than half the width w, the outer portion 19 having an almost constant thickness t may be formed against the inner wall of the trench 13. Also in such the case, the break of the charge balance described above in (Major Effect of First Embodiment) can be reduced effectively.

Figure 6:
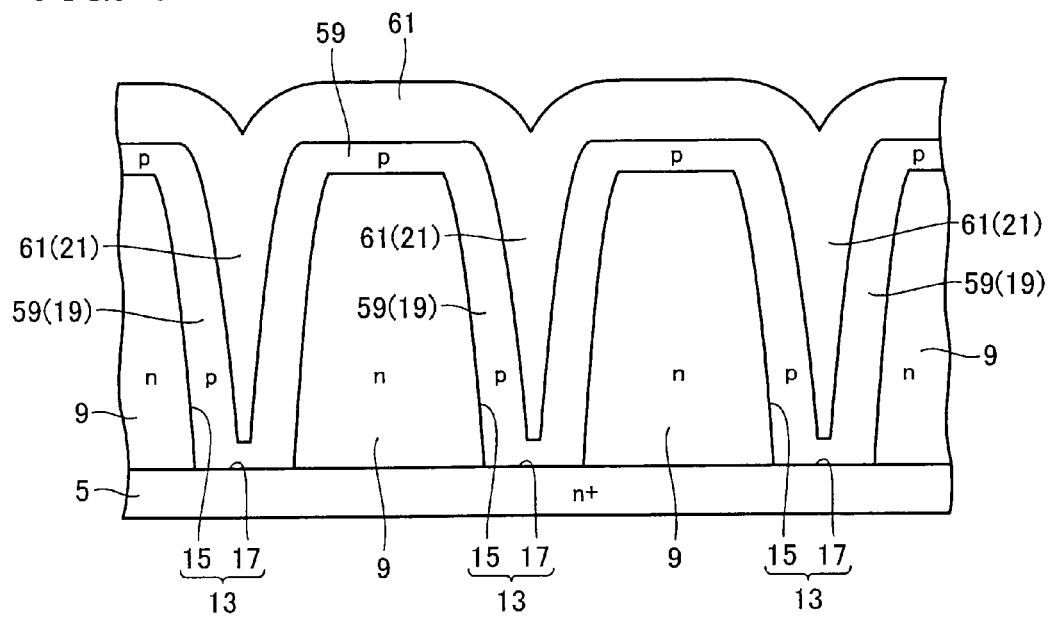
FIG. 6 shows a fourth step in the same method.

As the introduction of the impurity gas is halted, a non-doped epitaxial layer 61 is formed on the epitaxial layer 59, that is, in recesses located inner than the grown surfaces 59a, 59b as shown in FIG. 6. The epitaxial layer 61, grown on the outer portion 19, fills the trenches 13 to form the inner portion 21 having the direction of the length in the direction of the depth of the trench 13. At this moment, the inner portion 21 contains no p-type impurity. When a thermal treatment is executed subsequently on production of the semiconductor device, the p-type impurity from the outer portion 19 diffuses into the inner portion 21, which finally becomes a region having a lower p-type impurity concentration than the outer portion 19 has. Accordingly, in the drawings that follow FIG. 6, the inner portion 21 is depicted with an impurity concentration of "p⁻". In this way, the inner portion 21 inevitably becomes p-type. Therefore, instead of the non-doped epitaxial layer 61, an epitaxial layer having a lower p-type impurity concentration than that in the outer portion 19 may be formed.

Halting the introduction of the impurity gas switches the growth of the p-type epitaxial layer 59 to the growth of the non-doped epitaxial layer 61. Accordingly, the outer portion 19 and the inner portion 21 can be formed in the same chamber.

Figure 7:
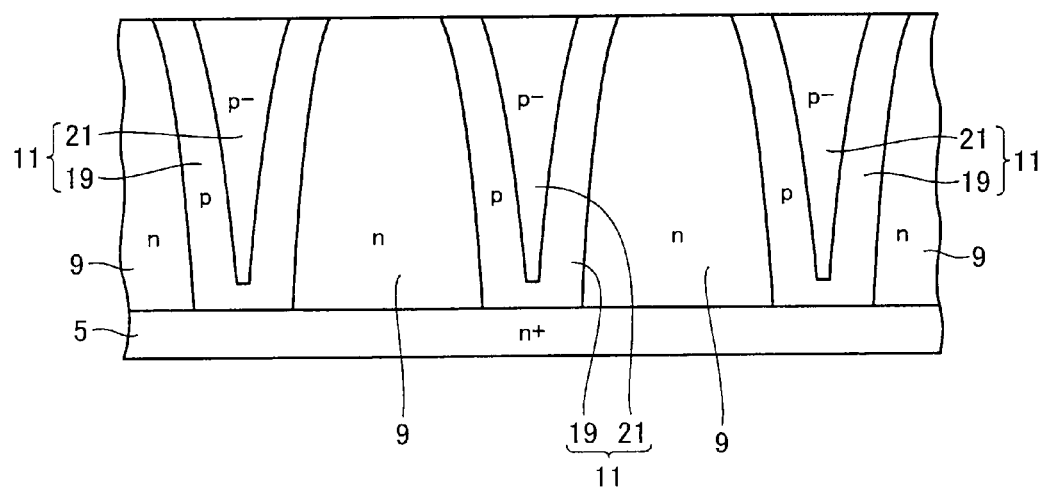
FIG. 7 shows a fifth step in the same method.

As shown in FIG. 7, the epitaxial layers 59, 61 located above the first semiconductor regions 9 are removed by applying CMP (Chemical Mechanical Polishing), for example, to planarize the second semiconductor regions 11.

Figure 8:
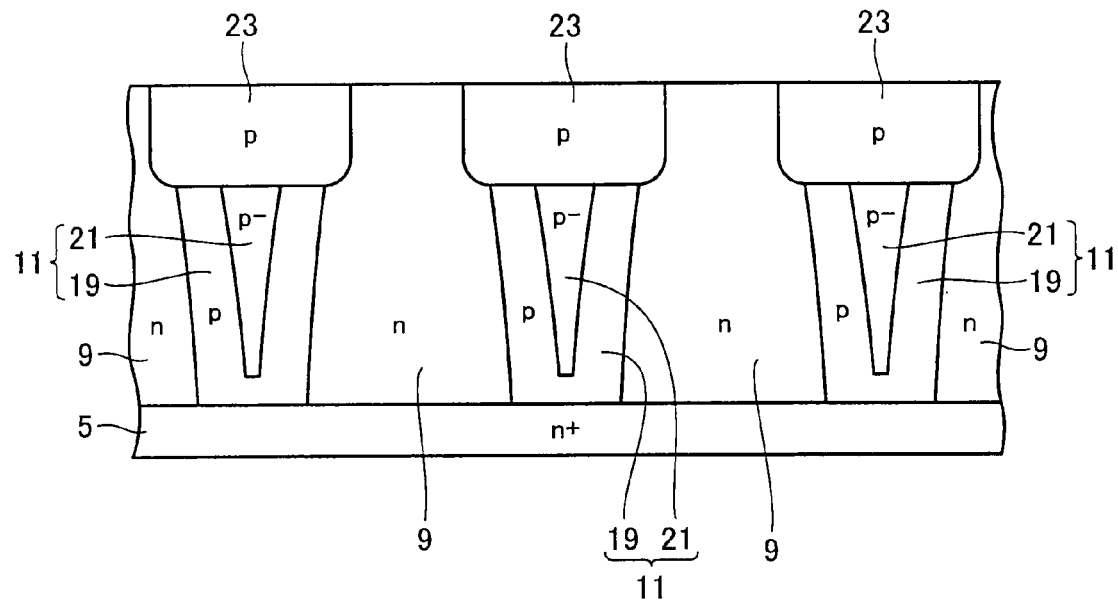
FIG. 8 shows a sixth step in the same method.

As shown in FIG. 8, with a mask of resist, not shown, ions are selectively implanted into the first and second semiconductor regions 9, 11 to form p-type base regions 23.

Figure 9:
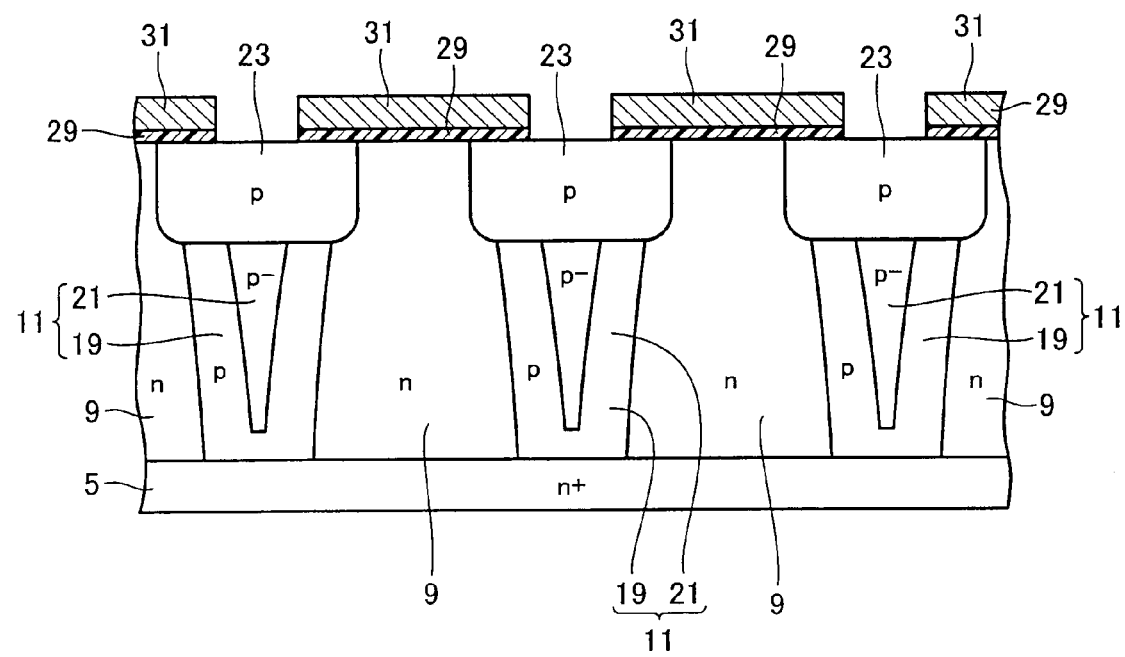
FIG. 9 shows a seventh step in the same method.

As shown in FIG. 9, under an oxidative high-temperature ambient, a silicon oxide film for use in the gate insulator 29 is formed over the entire surface of the first semiconductor regions 9 and the base regions 23. A polysilicon film for use in the gate electrode 31 is formed on the silicon oxide film by applying CVD (Chemical Vapor Deposition), for example. The polysilicon film and the silicon oxide film are then patterned to form the gate electrode 31 and the gate insulator 29.

As shown in FIG. 1, publicly known technologies are then employed to form the source region 25, the contact region 27, the interlayer insulator 35, the gate lead 37, the source electrode 39 and the drain electrode 41 and thus complete the semiconductor device 1.

Second Embodiment

Figure 10:
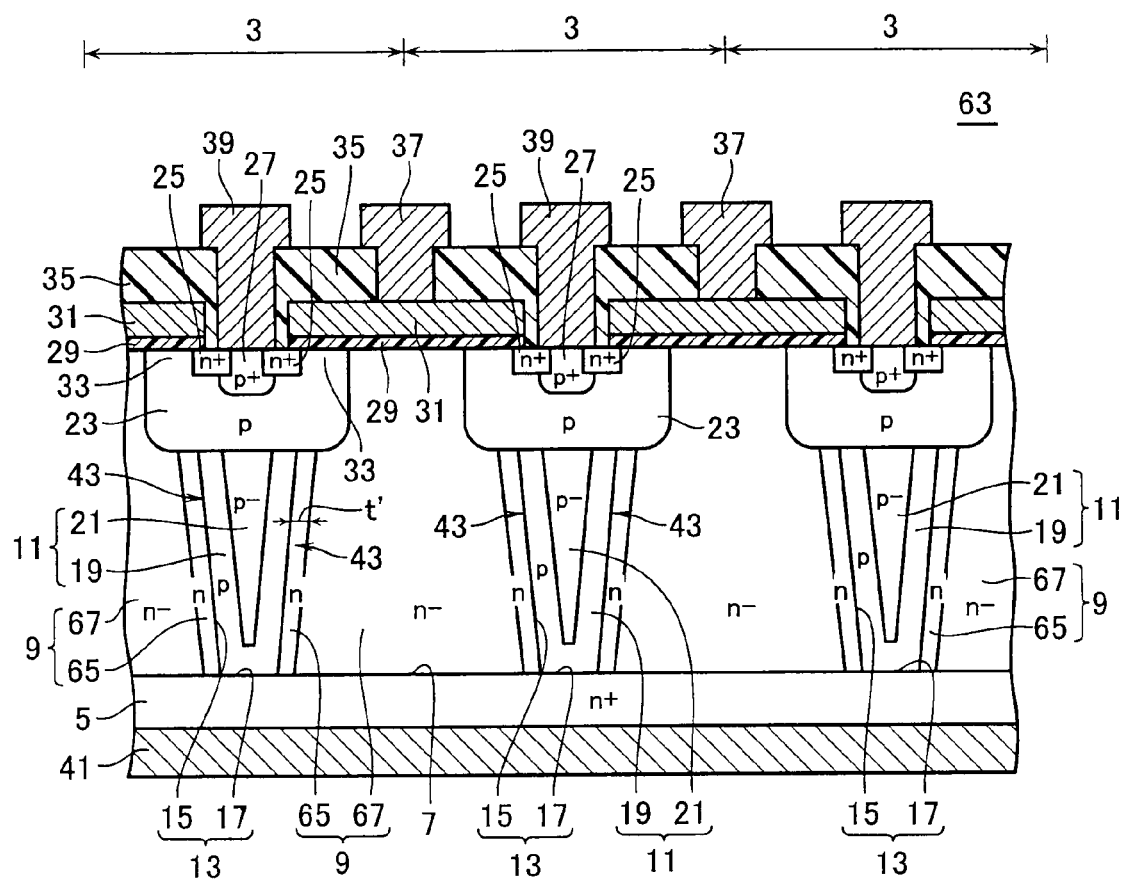
FIG. 10 is a vertical cross-sectional view of part of a semiconductor device according a second embodiment.

FIG. 10 is a vertical cross-sectional view of part of a semiconductor device 63 according a second embodiment. In the second embodiment, the first semiconductor region 9 is also composed of an outer portion 65 and an inner portion 67. The outer portion 65 and the inner portion 67 both are of n-type. The impurity concentration is higher in the outer portion 65 than in the inner portion 67: the outer portion 65 has an impurity concentration of "n" while the inner portion 67 has an impurity concentration of "n$^{-}$".

The outer portion 65 in the first semiconductor region 9 is formed opposite the outer portion 19 of the second semiconductor region 11 and against the side 15 of the trench 13. The outer portion 65 has an upper end brought into contact with the base region 23 and a lower end brought into contact with the semiconductor substrate 5. On formation of the outer portion 65, the thickness thereof is almost constant. The limitation, "on formation of the outer portion 65", is given for the same reason as in the case of the outer portion 19. The inner portion 67 is formed inner than the outer portion 65. The inner portion 67 has an upper end brought into contact with the gate insulator 29 and a lower end brought into contact with the semiconductor substrate 5.

In the second embodiment, the first semiconductor region 9 is composed of the outer portion 65 and the inner portion 67. Accordingly, as for the first semiconductor region 9, the number of impurity atoms in the regions N1, N2, . . . Nm hardly varies so much and remains almost unchanged as becoming more distant from the surface 7. Thus, in the second embodiment, in both of the regions N1, N2, . . . Nm and the regions P1, P2 . . . Pm, the number of impurity atoms hardly varies so much and remains almost unchanged as becoming more distant from the surface 7. Accordingly, the break of the charge balance can be made much smaller.

To be balanced with the outer portion 19 of the second semiconductor region 11, the n-type impurity concentration in the outer portion 65 is determined almost same as the p-type impurity concentration in the outer portion 19. Therefore, the outer portion 65 has an impurity concentration of "n" while the inner portion 67 is determined to have a lower n-type impurity concentration and has an impurity concentration of "n$^{-}$".

A method of manufacturing the semiconductor device 63 according to the second embodiment is described with reference to FIGS. 11 and 12. These figures are vertical cross-sectional views showing part of steps in the method of manufacturing the semiconductor device 63 shown in FIG. 10.

Figure 11:
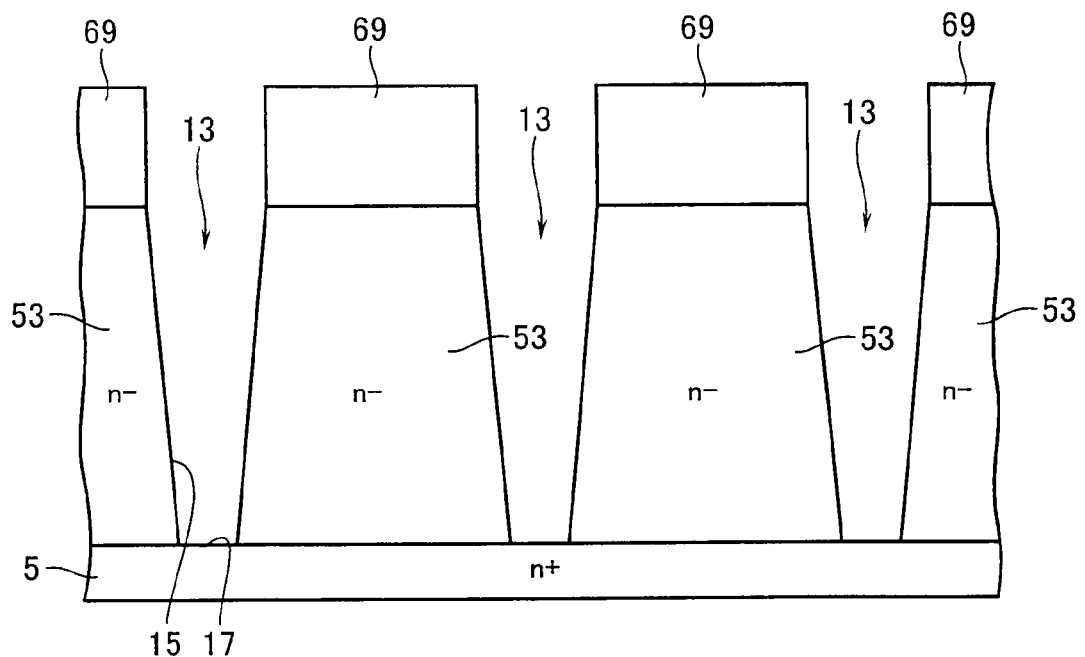
FIG. 11 shows a first step in a method of manufacturing the semiconductor device according the second embodiment.

As shown in FIG. 11, a mask member 69 such as resist and silicon oxide is employed as a mask to form the trenches 13 in the n-type single crystal semiconductor layer 53. This step corresponds to that shown in FIG. 4 of the first embodiment. The n-type impurity concentration in the single crystal semiconductor layer 53 is "n" in FIG. 4 while it is determined at a lower impurity concentration of "n$^{-}$" in the second embodiment. The side 15 of the trench 13 has a smoothly curved slanting surface in FIG. 4 while it has a linear slanting surface in the second embodiment. These sides can be formed through publicly known technologies. The second embodiment has the above differences compared with the first embodiment. This is because slanting ion implantation is applied to part of the single crystal semiconductor layer 53 at the following step shown in FIG. 12 to form the outer portion 65 with an almost constant thickness.

Figure 12:
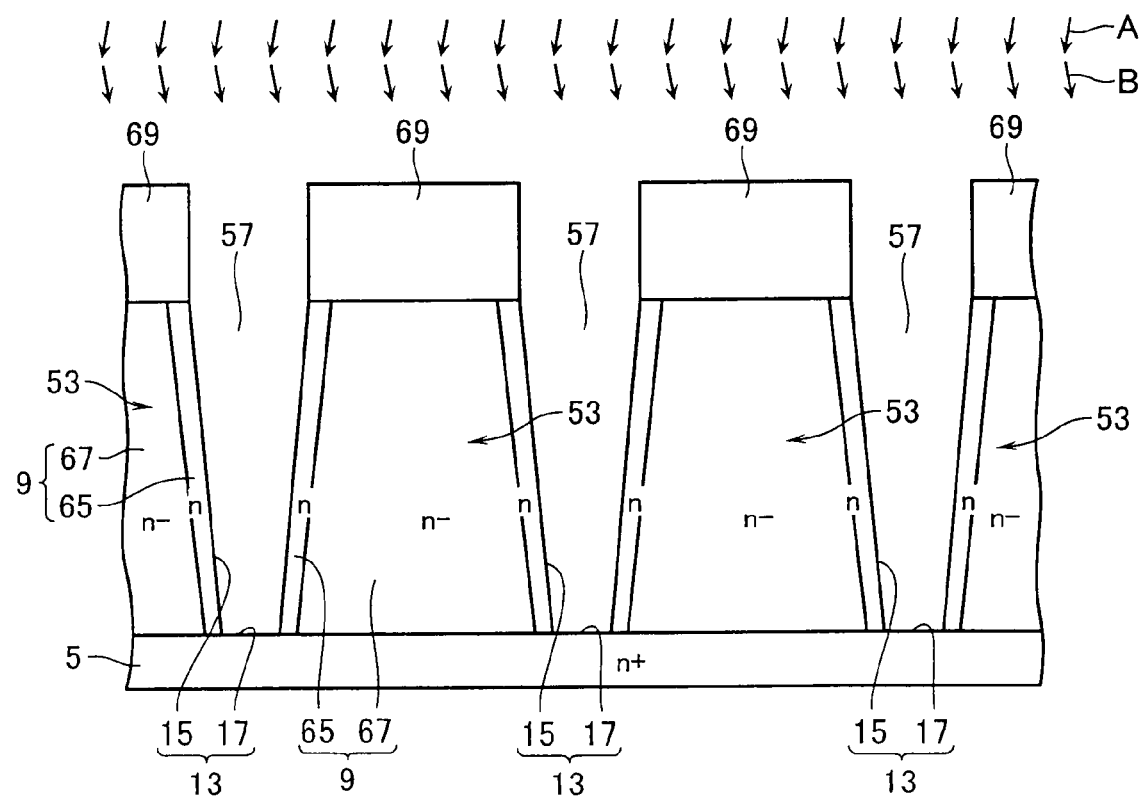
FIG. 12 shows a second step in the same method.

As shown in FIG. 12, with the mask of the mask member 69, ions of an n-type impurity (such as phosphorous and arsenic) are implanted into the side 15 in a slanting direction toward the lower left position relative to the semiconductor substrate 5 as indicated by the arrow A. Subsequently, the ions are implanted into the side 15 in a slanting direction toward the lower right position relative to the semiconductor substrate 5 as indicated by the arrow B. As a result, the outer portion 65 having an impurity concentration of "n" is formed against the side 15 of the trench 13. The portion inner than the outer portion 65 still has an impurity concentration of "n$^{-}$" and turns into the inner portion 67. Thus, the first semiconductor region 9 including the outer portion 65 and the inner portion 67 is formed. As the side 15 of the trench 13 has a linear slanting surface, the thickness of the outer portion 65 can be made almost same. Subsequent process steps may be achieved in the following two ways.

In one way, after removal of the mask member 69, the semiconductor device 63 (FIG. 10) is completed through the same steps as those from the step of FIG. 5 in the first embodiment. In another way, while the mask member 69 still remains, the epitaxial layers 59, 61 are buried as shown in FIGS. 5 and 6 in the first embodiment, and the epitaxial layers 59, 61 grown on the mask member 69 are then removed by CMP or the like. After removal of the mask member 69, the semiconductor device 63 (FIG. 10) is completed through the same steps as those from the step of FIG. 8 in the first embodiment.

Third Embodiment

Figure 13:
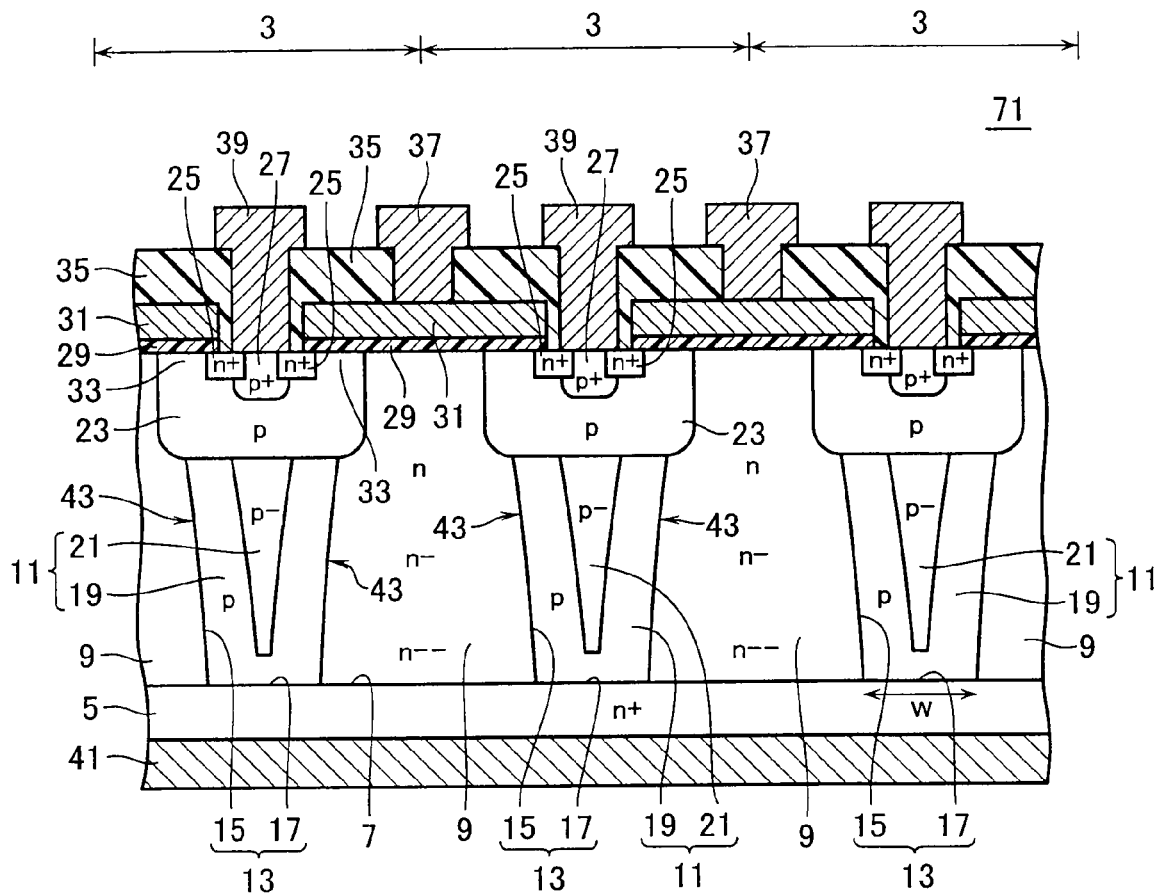
FIG. 13 is a vertical cross-sectional view of part of a semiconductor device according a third embodiment.

FIG. 13 is a vertical cross-sectional view of part of a semiconductor device 71 according a third embodiment. The regions N1, N2, . . . Nm has impurity concentrations controlled to elevate as becoming more distant from the surface 7 of the semiconductor substrate. This is a difference between the third embodiment and the first embodiment shown in FIG. 1. FIG. 13 shows the elevation of the n-type impurity concentration as "n$^{--}$, n$^{-}$, n". The impurity concentration may be controlled to elevate in the form of steps or in the form of a smooth curve or straight line.

Both in the first and third embodiments, the inner portion 21 with the impurity concentration of "p$^{-}$" has the width that extends as becoming more distant from the surface 7. Therefore, the number of impurity atoms in the inner portion 21 of the regions P1, P2, . . . Pm increases more or less as becoming more distant from the surface 7. The impurity concentration in the inner portion 21 is relatively small and neglected in the first embodiment. Strictly, the above increase in the inner portion 21 may increase the number of impurity atoms in the inner portion 21 and outer portion 19 in the regions P1, P2, . . . Pm more or less as becoming more distant from the surface 7.

In the third embodiment, the regions N1, N2, . . . Nm are controlled to have impurity concentrations that elevate as becoming more distant from the surface 7, to increase the number of impurity atoms in the regions N1, N2, . . . Nm as becoming more distant from the surface 7. Thereby, charge balance between the regions N1, N2, . . . Nm and the regions P1, P2, . . . Pm, can be established.

The reduction in the width of the regions N1, N2, . . . Nm as becoming more distant from the surface 7 decreases the number of impurity atoms. To cancel the reduction, the impurity concentration in the regions N1, N2, . . . Nm can be controlled to elevate as becoming more distant from the surface 7. This is effective to make the number of impurity atoms in the regions N1, N2, . . . Nm almost same. Also in this case, like the second embodiment, it is possible to improve the charge balance between the region Nr and the region Pr.

Figure 14:
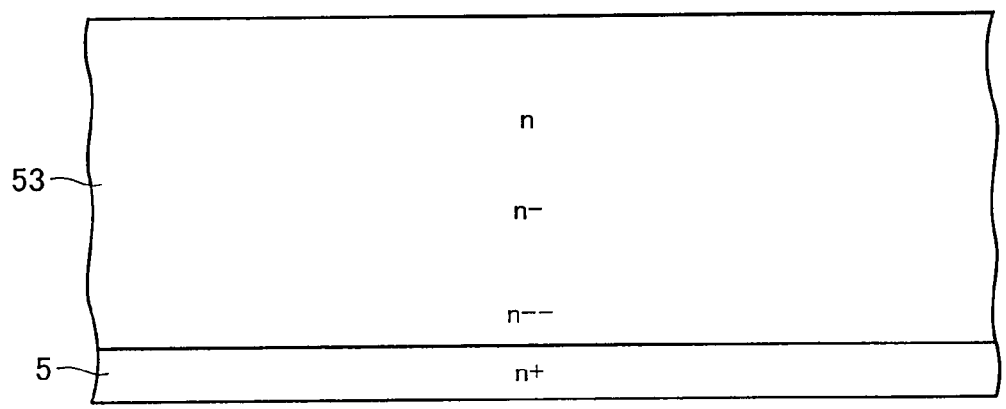
FIG. 14 is an illustrative view of a method of forming a semiconductor region according the third embodiment.

A method of manufacturing the first semiconductor region 9 according to the third embodiment is described with reference to FIG. 14. Stepwise elevation of the concentration of a dopant gas of phosphorous added to the material gas or stepwise reduction in flow of the material gas can increase the relative concentration of the dopant gas stepwise during epitaxial growth. As a result, over the entire surface 7 of the semiconductor substrate 5, a single crystal semiconductor layer 53 can be formed, which has an impurity concentration slanting such that the impurity concentration increases as becoming more distant from the surface 7.

In the third embodiment, the impurity concentration is controlled to elevate in two stages. In the first stage, the impurity concentration is controlled to elevate from "n$^{--}$" to "n$^-$", and in the second stage, the impurity concentration is controlled to elevate from "n$^-$" to "n". The stages are not limited to two but may be more than one. Thereafter, like the first embodiment, the trenches 13 are formed in the single crystal semiconductor layer 53 to form the first semiconductor regions 9.

Fourth Embodiment

Figure 15:
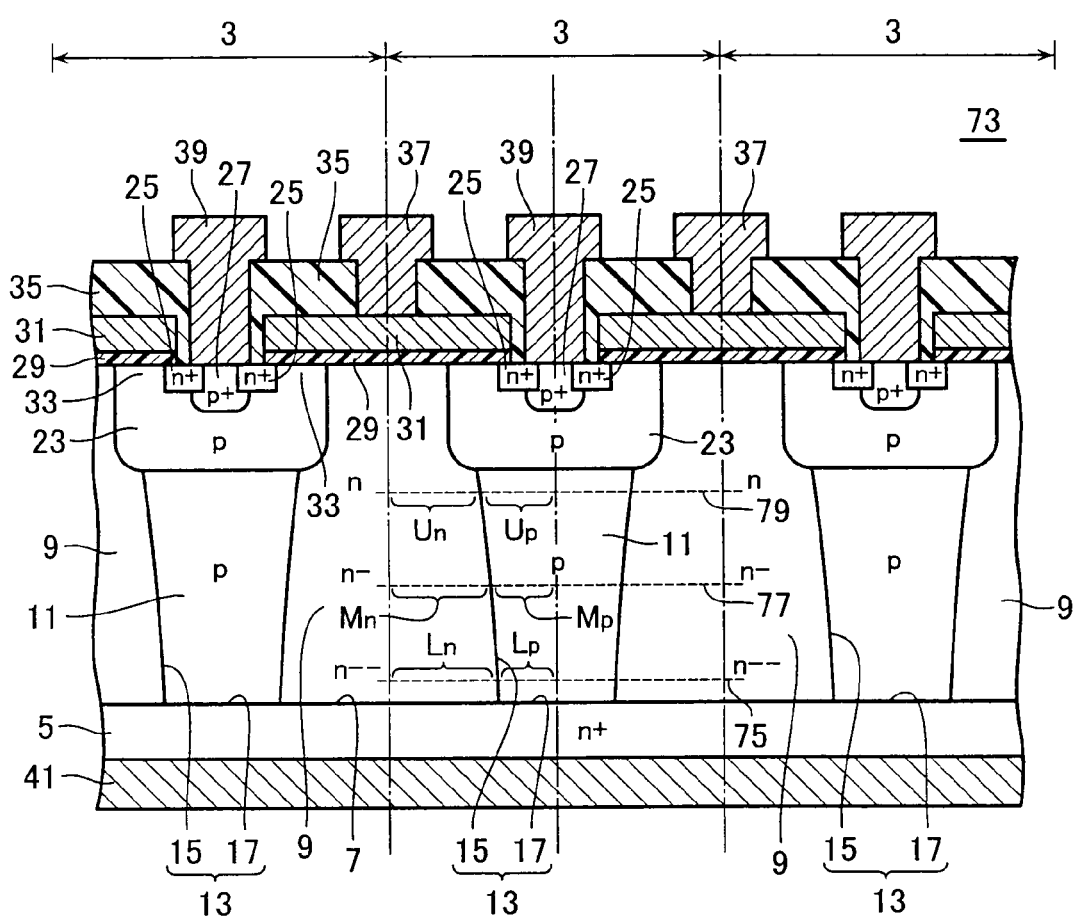
FIG. 15 is a vertical cross-sectional view of part of a semiconductor device according a fourth embodiment.

FIG. 15 is a vertical cross-sectional view of part of a semiconductor device 73 according a fourth embodiment, in which the second semiconductor region 11 has an overall impurity concentration of "p", different from the third embodiment of FIG. 13. Also in the fourth embodiment, the number of impurity atoms in the region P1, P2, . . . Pm increases as becoming more distant from the surface 7. Nevertheless, the charge balance between the region Nr and the region Pr can be established for the following reason. The first semiconductor region 9 is controlled to have impurity concentrations that elevate as becoming more distant from the surface 7. Thus, the number of impurity atoms in the region N1, N2, . . . Nm can also increase as becoming more distant from the surface 7.

Further, in the fourth embodiment, the number of impurity atoms in the region Nr is determined almost equal to that in the region Pr in the superjunction structure as described below in more detail. The impurity concentrations in the first semiconductor region 9 are determined in order of "n$^{--}$", "n$^-$", and "n" from below. Accordingly, respective positions in the vertical direction of the superjunction structure are classified into a lower portion 75 (a region N1, a region P1), a middle portion 77 (a region N2, a region P2), and an upper portion 79 (a region N3, a region P3). Note that the distances between these portions are approximately 10 micrometers for example, and each portion is defined to have a depth and width (perpendicular to the paper) of about 1 micrometer. In half the MOSFET cell 3, the lower portion 75 has the number of impurity atoms, $L_n$, in the first semiconductor region 9 and the number of impurity atoms, $L_p$, in the second semiconductor region 11. The middle portion 77 has the number of impurity atoms, $M_n$, in the first semiconductor region 9 and the number of impurity atoms, $M_p$, in the second semiconductor region 11. The upper portion 79 has the number of impurity atoms, $U_n$, in the first semiconductor region 9 and the number of impurity atoms, $U_p$, in the second semiconductor region 11.

The fourth embodiment is designed to satisfy $L_p \approx L_n$, $M_p \approx M_n$, and $U_p \approx U_n$. Accordingly, the number of impurity atoms in the first semiconductor region 9 can be determined almost equal to that in the second semiconductor region 11 at each of the regions aligned in the vertical direction of the superjunction structure. This is effective to further improve the charge balance. This can be also mentioned to the embodiments already described and embodiments to be described hereinafter.

Fifth Embodiment

Figure 16:
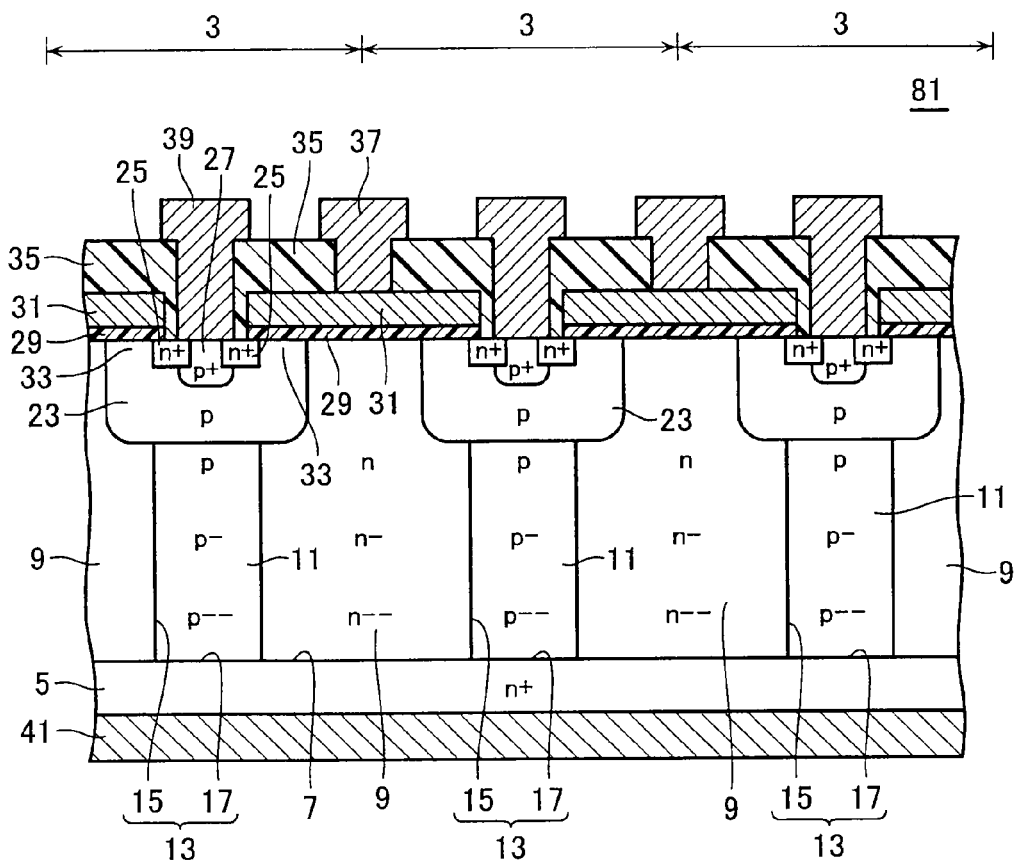
FIG. 16 is a vertical cross-sectional view of part of a semiconductor device according a fifth embodiment.

FIG. 16 is a vertical cross-sectional view of part of a semiconductor device 81 according a fifth embodiment. In the preceding embodiments, the epitaxial layers are continuously grown to form the second semiconductor region 11 in the trench 13. To the contrary, in the fifth embodiment, growing an epitaxial layer and etching the grown layer are alternately repeated (as so-called the multi-steps) to form the semiconductor region 11 in the trench 13. The fifth embodiment is mainly characterized in that the impurity concentrations in the first and second semiconductor regions 9, 11 are controlled to elevate as becoming more distant from the surface 7. The elevation of the p-type impurity concentration is shown as "p$^{--}$, p$^-$, p". The p-type impurity concentrations may be controlled to elevate in the form of steps or in the form of a smooth curve or straight line, like n-type.

In the fifth embodiment, the side 15 of the trench 13 is made almost vertical for the following reason. As the second semiconductor region 11 is formed through multi-steps, the trench 13 can be filled even if the trench 13 is not provided with a wider entry. Like in the preceding embodiments, the width of the trench 13 may be determined to extend as becoming more distant from the bottom 17 of the trench.

Figure 17:
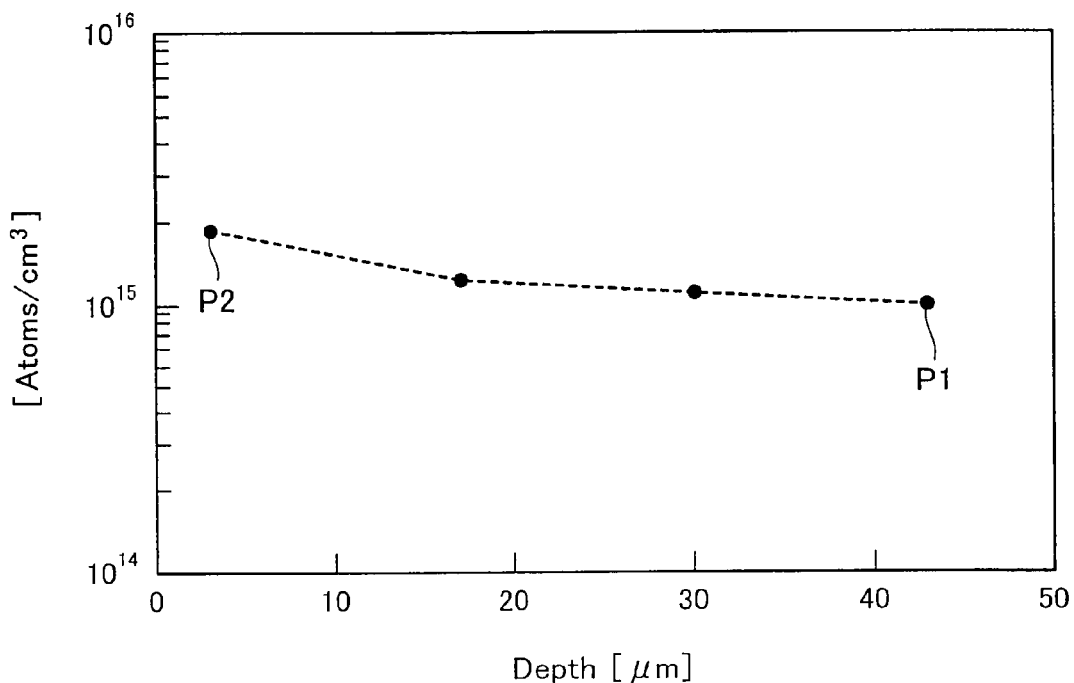
FIG. 17 is a graph showing impurity concentrations in an epitaxial layer formed through multi-steps.

The impurity concentrations in the second semiconductor region 11 is determined to elevate as becoming more distant from the surface 7 for the reason described below. A secondary ion mass spectrometry (SIMS) was applied to analyze the p-type epitaxial layer, which is buried by multi-steps in the trench having an almost vertical side. This result is shown as a graph in FIG. 17. The lateral axis [μm] indicates depths in the trench from "0" indicative of the entry of the trench. The vertical axis [Atoms/cm$^3$] indicates the number of atoms of an impurity of boron.

The number of boron atoms in the p-type epitaxial layer increases as approaching from below to above in the trench. In the epitaxial layer, the number of boron atoms (P2) at the upper portion is almost double that (P1) at the lower portion. As the side of the trench is almost vertical, the impurity concentration in the p-type epitaxial layer elevates as approaching from below to above in the trench. As can be found from the above, the formation of the impurity region by multi-steps increases the impurity concentration as becoming more distant from the surface 7.

If the trench width is narrow as in the trench 13 (for example, below 1 μm), a larger amount of boron is taken into the epitaxial layer at the upper portion of the trench compared to the lower portion for the following reason. An impurity gas of $B_2H_6$ is supplied together with a Si-based material gas to grow a p-type epitaxial layer inside the trench. The upper portion of the trench is closer to a source of the impurity gas and accordingly a larger amount of boron is taken into the epitaxial layer. In contrast, the lower portion of the trench is farther from the source of the impurity gas and accordingly the impurity gas is not supplied sufficiently thereto and the amount of boron taken into the epitaxial layer is less.

The side 15 of the trench is almost vertical and accordingly the width of the first semiconductor region 9 is almost constant. Therefore, if the entire of the first semiconductor region 9 is of either one of "n", "n$^-$", and "n$^{--}$", the number of impurity atoms in the regions N1, N2, . . . Nm hardly varies and remains almost unchanged as becoming more distant from the surface 7. In contrast, the number of impurity atoms in the regions P1, P2, . . . Pm increase as becoming more distant from the surface 7.

Therefore, if the entire of the first semiconductor region 9 is determined to have either one of the impurity concentrations of "n", "n⁻" and "n⁻⁻", the charge balance between the first semiconductor region 9 and the second semiconductor region 11 is broken. In the fifth embodiment, the impurity concentration in the first semiconductor region 9 is controlled to elevate as becoming more distant from the surface 7. Accordingly, the charge balance between the first semiconductor region 9 and the second semiconductor region 11 can be improved.

A method of manufacturing the semiconductor device 81 according to the fifth embodiment is described next with reference to FIGS. 18-22. These figures are vertical cross-sectional views showing the method of manufacturing the semiconductor device 81 shown in FIG. 16 step by step.

Figure 18:
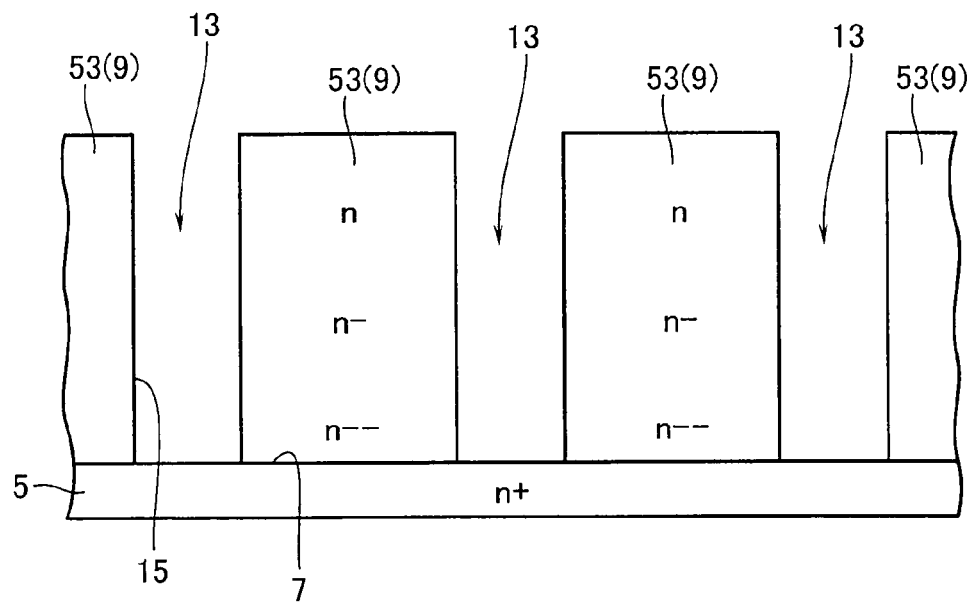
FIG. 18 shows a first step in a method of manufacturing the semiconductor device according the fifth embodiment.

As shown in FIG. 18, a single crystal semiconductor layer 53 is formed to haven-type impurity concentrations that elevate as becoming more distant from the surface 7. This step is same as the step shown in FIG. 14. Then, trenches 13 are formed in the single crystal semiconductor layer 53. This step is same as the step of forming the trenches 55 shown in FIG. 3. Therefore, the side 15 of the trench 13 is almost vertical.

Figure 19:
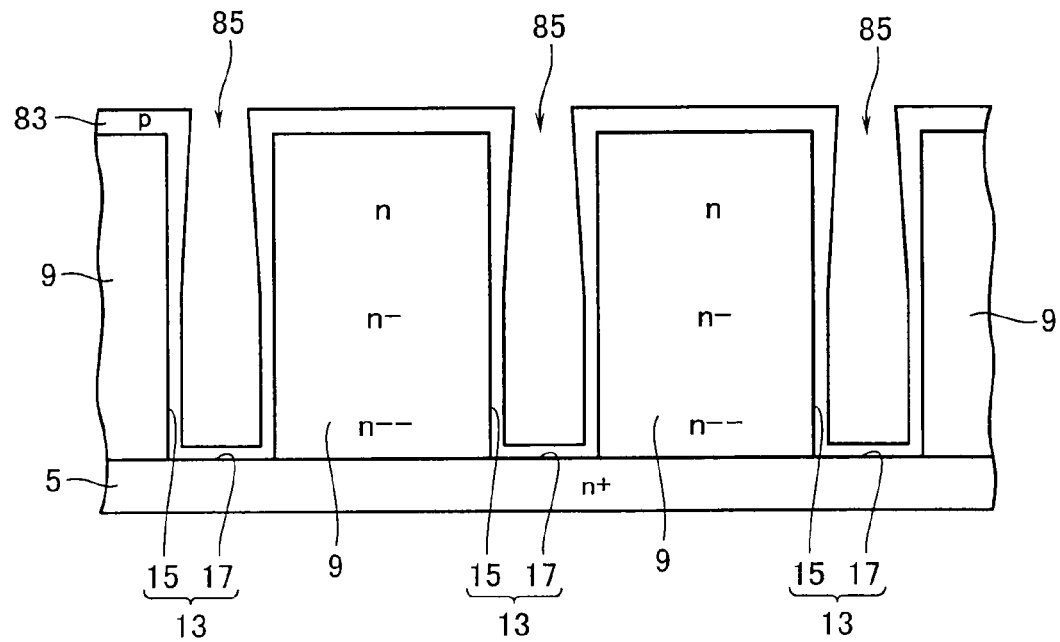
FIG. 19 shows a second step in the same method.

As shown in FIG. 19, a p-type epitaxial layer 83 is grown on the first semiconductor regions 9 and on the side 15 and the bottom 17 of the trench 13. This step is same as the step of forming the epitaxial layer 59 described in FIG. 5. In the fifth embodiment, however, the epitaxial growth is halted at a stage when the thickness of the epitaxial layer 83 reaches 1.0-1.5 µm, for example, for the following reason. In the trench 13, the epitaxial layer grows easier in the upper portion than in the lower portion. Therefore, if the epitaxial layer is allowed to grow as it does, an entry 85 of the trench 13 is closed before the trench 13 is completely filled with the epitaxial layer.

Figure 20:
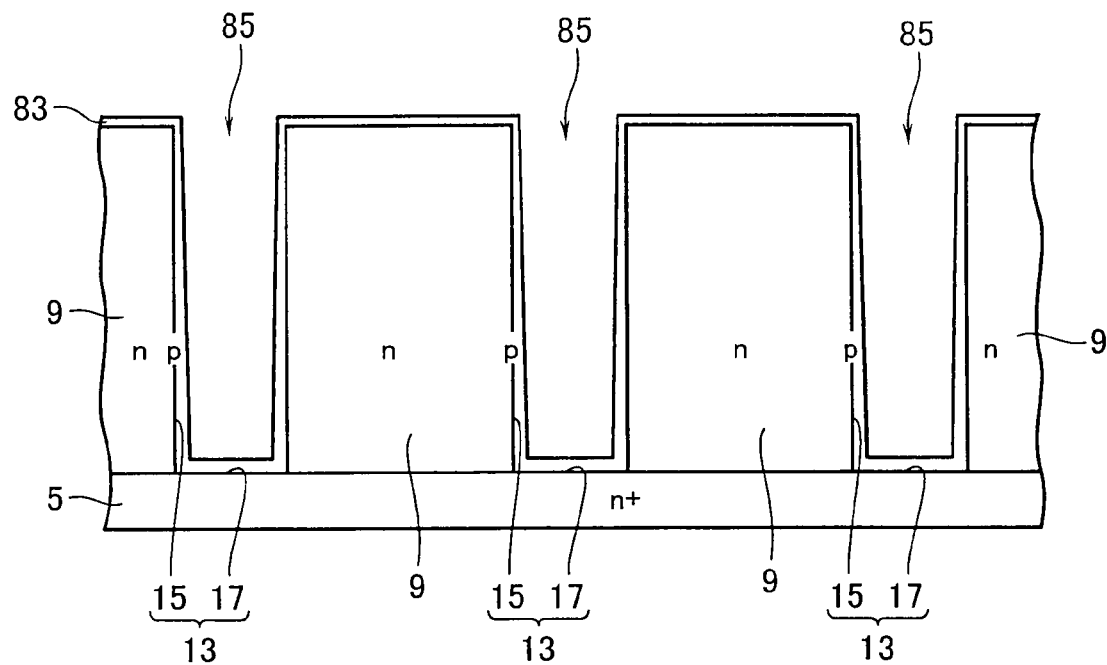
FIG. 20 shows a third step in the same method.

As shown in FIG. 20, the epitaxial layer 83 is subjected to etching with HCl, for example. This etching develops faster at the upper portion than at the lower portion in the trench 13. Accordingly, the thickness of the epitaxial layer 83 can be made smaller at the upper portion than at the lower portion. As a result, the entry 85 can be extended.

Figure 21:
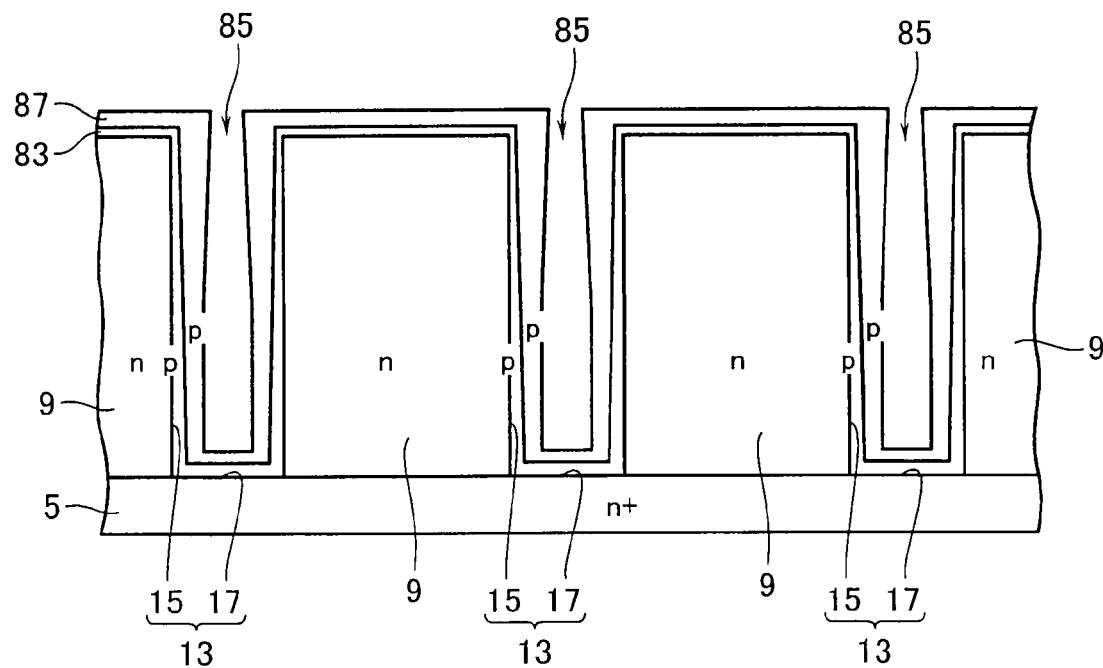
FIG. 21 shows a fourth step in the same method.

As shown in FIG. 21, under the same condition as that for the growth of the p-type epitaxial layer 83, a p-type epitaxial layer 87 is grown on the epitaxial layer 83. This epitaxial growth is halted at a stage when the thickness of the epitaxial layer 87 reaches 1.0-1.5 µm, for example.

Figure 22:
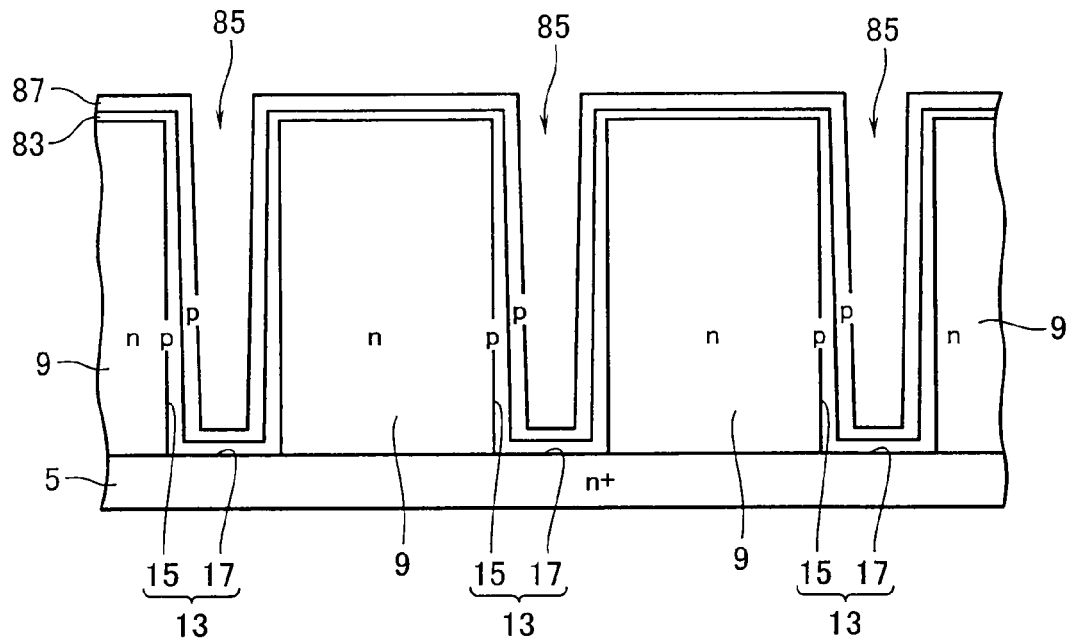
FIG. 22 shows a fifth step in the same method.

As shown in FIG. 22, like the step of FIG. 20, the epitaxial layer 87 is subjected to etching with HCl, for example, to extend the entry 85. The steps of forming the epitaxial layer and etching the layer are repeated as above to form the epitaxial layers buried in the trench 13, which are used in the second semiconductor region 11. Subsequent steps are same as those from the step described in FIG. 7.

Sixth Embodiment

Figure 23:
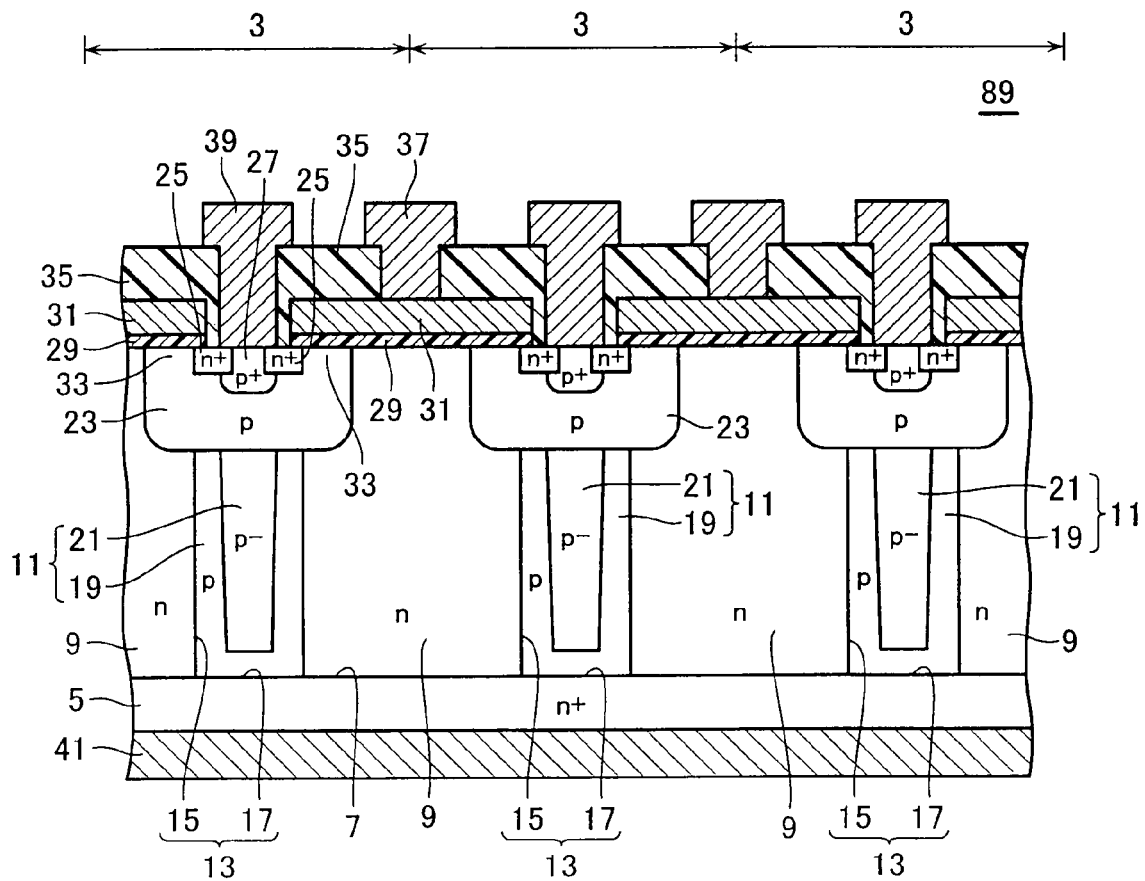
FIG. 23 is a vertical cross-sectional view of part of a semiconductor device according a sixth embodiment.

FIG. 23 is a vertical cross-sectional view of part of a semiconductor device 89 according a sixth embodiment. The semiconductor device 89 includes an outer portion formed by multi-steps. This is different from the semiconductor device 1 of the first embodiment.

A method of manufacturing the semiconductor device 89 according to the sixth embodiment is described with reference to FIGS. 24 and 25. These figures are vertical cross-sectional views showing the method of manufacturing the semiconductor device 89 shown in FIG. 23 step by step.

Figure 24:
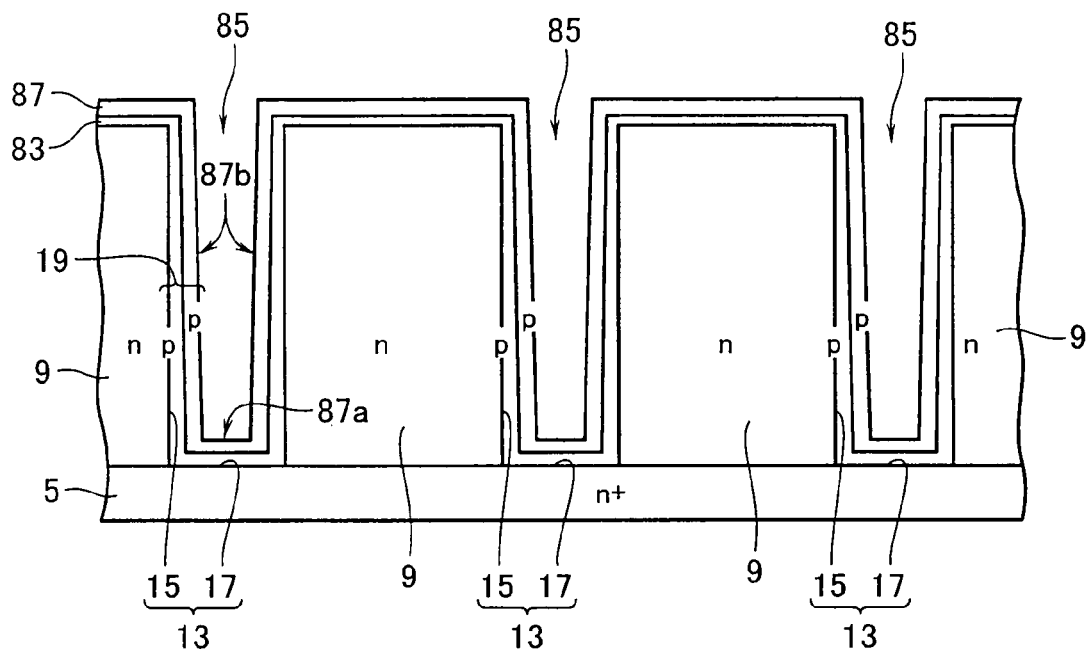
FIG. 24 shows a first step in a method of manufacturing the semiconductor device according the sixth embodiment.

As shown in FIG. 24, like the step of FIG. 22, the epitaxial layer 87 is subjected to etching with HCl, for example, to extend the entry 85. The epitaxial layers 83, 87 turn into the outer portion 19 with a high impurity concentration. In the outer portion 19, a grown surface 87a from the bottom 17 remains, and grown surfaces 87b from the sides 15 separate from each.

Figure 25:
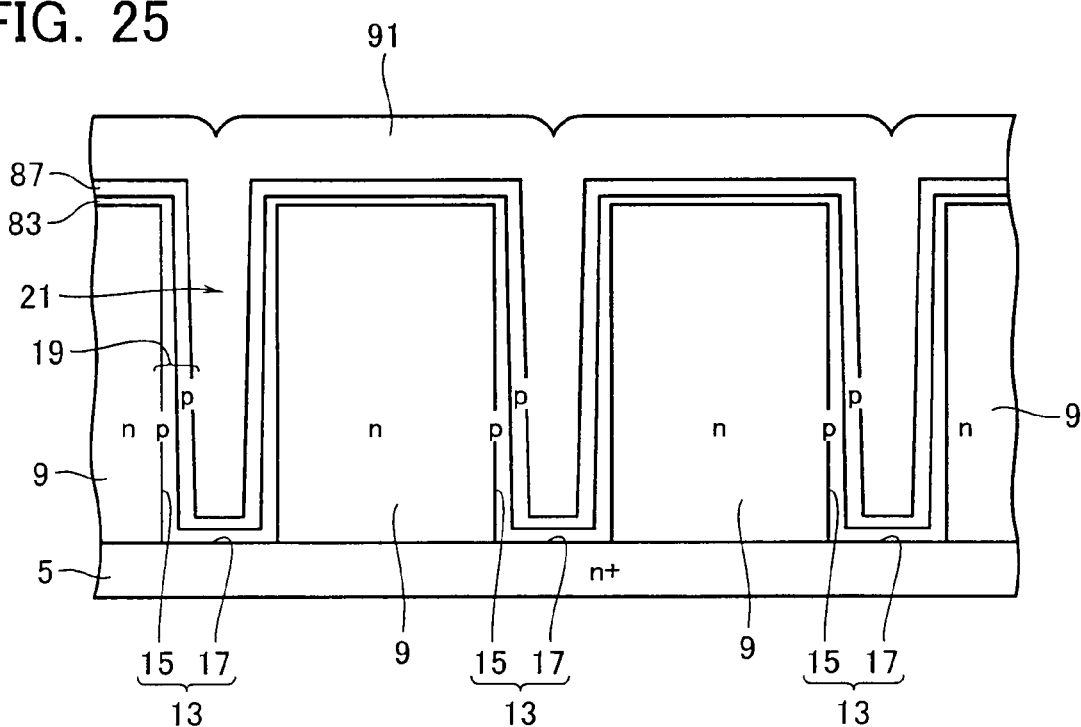
FIG. 25 shows a second step in the same method.

As shown in FIG. 25, a non-doped epitaxial layer 91 is grown on the epitaxial layer 87 to fill the trench 13 with the layer 91. This is same as the step of FIG. 6. The epitaxial layer 91 grown on the epitaxial layer 87 turns into the inner portion with a low impurity concentration. Like in the first embodiment, instead of the non-doped epitaxial layer 91, an epitaxial layer with a lower p-type impurity concentration than that in the outer portion 19 may be formed. Subsequent steps are same as those from the step described in FIG. 7.

As the side 15 of the trench is almost vertical, the outer portion 19 can be formed not by a single step of epitaxial growth but by multi-steps. In the fifth embodiment, formation of the epitaxial layers by multi-steps results in the impurity concentration that elevates as becoming more distant from the surface 7, as described with reference to FIG. 17.

Figure 26:
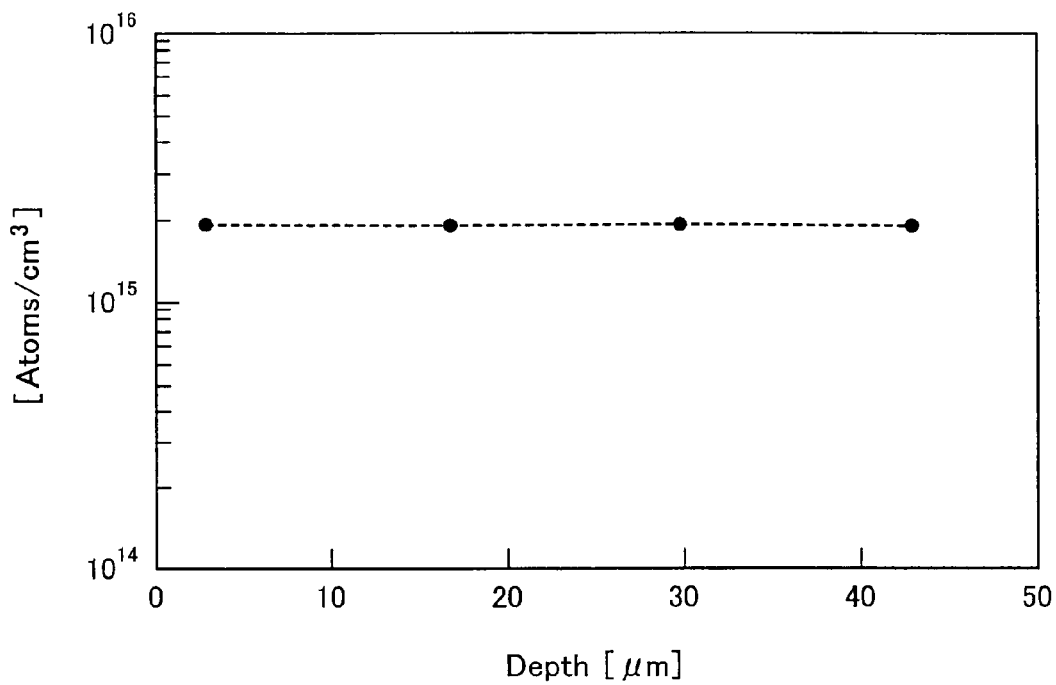
FIG. 26 is a graph showing impurity concentrations in an epitaxial layer when multi-steps are halted in the middle thereof.

Instead of burying the epitaxial layer completely in the trench 13 by multi-steps, burying it may be halted in the middle. In this case, it has been found that the epitaxial layer (that is, the outer portion 19) formed by multi-steps is prevented from having such the impurity concentration that elevates as becoming more distant from the surface 7. This is described with reference to FIG. 26. FIG. 26 is a graph showing a result obtained by a secondary ion mass spectrometry for analysis of the epitaxial layer halted in the middle. The vertical and lateral axes of the graph are same as those in FIG. 17, respectively. When the width of the outer portion 19 reaches 1 µm or more, for example, burying by multi-steps is halted. It has been found that the number of boron atoms is almost constant within a range from the lower portion to the upper portion in the trench.

As described above, like in the first embodiment, the sixth embodiment can improve the charge balance between the first semiconductor region 9 and the second semiconductor region 11. The side 15 of the trench may not be made almost vertical and, like in the first through fourth embodiments, the width of the trench 13 may be designed to extend as becoming more distant from the bottom 17 of the trench.

[Alternatives]

Finally, alternatives of the first through sixth embodiments are described briefly.

Figure 27:
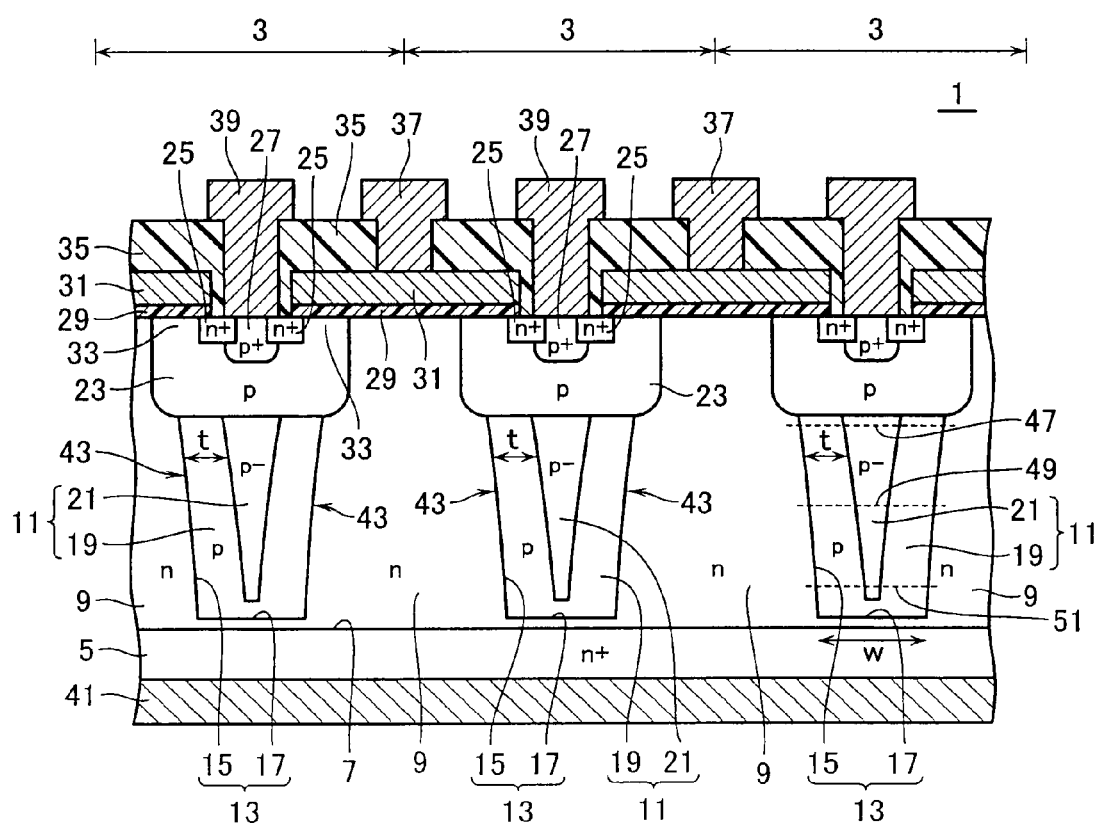
FIG. 27 shows one of alternatives of the embodiments of the present invention.

(1) In the first through sixth embodiments, the bottom 17 of the trench 13 reaches the semiconductor substrate 5. FIG. 27 shows an alternative structure, in which the bottom 17 does not reach the semiconductor substrate 5, and part of the first semiconductor region 9 remains between the bottom 17 and the semiconductor substrate 5. This structure may be adopted in one alternative embodiment of the present invention.

(2) In the first through sixth embodiments, the semiconductor region buried in the trenches 13 is the p-type semiconductor region. Alternatively, it may be an n-type semiconductor region. In this case, the trenches 13 are formed in the p-type single crystal semiconductor layer disposed on the semiconductor substrate 5, and an n-type epitaxial layer is buried in the trenches 13.

(3) In the first through sixth embodiments, the n-type semiconductor substrate 5 is employed. Alternatively, a p-type semiconductor substrate may be employed. In this case, the superjunction structure according to this alternative embodiment has the following two types. One structure includes trenches formed in a p-type, single crystal semiconductor layer disposed on the p-type semiconductor substrate 5, and an n-type epitaxial layer buried in the trenches. Another structure includes trenches formed in an n-type, single crystal semiconductor layer disposed on the p-type semiconductor substrate 5, and a p-type epitaxial layer buried in the trenches.

(4) The first through sixth embodiments are directed to the gate insulator film of the MOS type that contains a silicon oxide film though the present invention is not limited to this type. The present invention is also applicable to a gate insulator film of the MIS (Metal Insulator Semiconductor) type that contains an insulation film (such as a high dielectric film or ONO film) other than the silicon oxide film.

(5) The first through sixth embodiments are directed to the vertical MOSFET. Alternative embodiments of the present invention may include semiconductor devices capable of adopting the superjunction structure, such as IGBT (Insulated Gate Bipolar Transistor) and SBD (Schottky Barrier Diode).

(6) The semiconductor device according to the first through sixth embodiments is a semiconductor device comprising a silicon semiconductor. Alternative embodiments of the present invention may include semiconductor devices comprising other semiconductors (such as a silicon carbide and a gallium nitride).

What is claimed is:

1. A semiconductor device, comprising:
    a semiconductor substrate;
    a first semiconductor region, of a first conduction type formed on a surface of the semiconductor substrate;
    a plurality of trenches formed in the first semiconductor region at a certain interval; and
    a second semiconductor region of a second conduction type buried in the plurality of trenches, the second semiconductor region including an outer portion formed against an inner wall of the trench, and an inner portion formed inside the outer portion,
    the outer portion having a higher impurity concentration of the second conduction type than the inner portion.

2. The semiconductor device according to claim 1, wherein the plurality of trenches each has a width that increases becoming more distant from a bottom of the each trench.

3. The semiconductor device according to claim 1, wherein the outer portion has a substantially constant thickness.

4. The semiconductor device according to claim 1, wherein the outer portion has a substantially constant thickness, and the thickness of the outer portion is less than half the width of a bottom of the trench.

5. The semiconductor device according to claim 1, wherein a bottom of the trench reaches the semiconductor substrate.

6. The semiconductor device according to claim 1, wherein a part of the first semiconductor region is formed between the bottom of the each trench and the semiconductor substrate.

7. The semiconductor device according to claim 1, further comprising:
    a base layer of the second conduction type formed on the first semiconductor region;
    a source layer of the first conduction type formed on the base layer; and
    a gate electrode formed on the source layer and the first semiconductor region via a gate insulation film.

* * * * *